US011133327B2

(12) United States Patent
Jung et al.

(10) Patent No.: US 11,133,327 B2
(45) Date of Patent: Sep. 28, 2021

(54) THREE-DIMENSIONAL SEMICONDUCTOR DEVICE

(71) Applicant: SAMSUNG ELECTRONICS CO., LTD., Suwon-si (KR)

(72) Inventors: Young-jin Jung, Hwaseong-si (KR); Hyoung-ryeol In, Seoul (KR); Sung-han Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 78 days.

(21) Appl. No.: 16/383,855

(22) Filed: Apr. 15, 2019

(65) Prior Publication Data

US 2020/0083250 A1    Mar. 12, 2020

(30) Foreign Application Priority Data

Sep. 11, 2018  (KR) .................. 10-2018-0108513

(51) Int. Cl.
*H01L 27/11582* (2017.01)
*H01L 23/535* (2006.01)
*H01L 29/10* (2006.01)

(52) U.S. Cl.
CPC ...... *H01L 27/11582* (2013.01); *H01L 23/535* (2013.01); *H01L 29/1037* (2013.01)

(58) Field of Classification Search
CPC ............. H01L 23/535; H01L 27/11565; H01L 27/11573; H01L 27/11575; H01L 27/11582; H01L 29/1037
USPC ........................................................ 257/329
See application file for complete search history.

(56) References Cited

U.S. PATENT DOCUMENTS

| 8,971,118 | B2 | 3/2015 | Jin et al. | |
| 9,245,962 | B1 | 1/2016 | Yang et al. | |
| 9,653,562 | B2 | 5/2017 | Kim et al. | |
| 9,698,155 | B2 | 7/2017 | Shim et al. | |
| 9,859,363 | B2 | 1/2018 | Lu et al. | |
| 2012/0208347 | A1* | 8/2012 | Hwang | H01L 27/11582 438/430 |
| 2016/0049423 | A1* | 2/2016 | Yoo | H01L 27/1157 257/324 |
| 2016/0293627 | A1 | 10/2016 | Kim et al. | |
| 2017/0084624 | A1* | 3/2017 | Lee | H01L 27/1157 |
| 2017/0207221 | A1* | 7/2017 | Kim | H01L 27/11573 |
| 2017/0213846 | A1 | 7/2017 | Lee | |
| 2018/0026046 | A1* | 1/2018 | Nam | H01L 27/1157 257/314 |
| 2018/0090512 | A1* | 3/2018 | Kim | H01L 21/283 |
| 2018/0166454 | A1* | 6/2018 | Pyon | A61K 47/44 |

* cited by examiner

*Primary Examiner* — Duy T Nguyen
(74) *Attorney, Agent, or Firm* — F. Chau & Associates, LLC

(57) ABSTRACT

A three-dimensional semiconductor device includes: a common source line passing between a first channel structure and a second channel structure and between a first dummy channel structure and a second dummy channel structure, in which a distance in a first direction between the common source line and the first channel structure is equal to a distance in the first direction between the common source line and the second channel structure, and a distance in the first direction between the common source line and the first dummy channel structure is different from a distance in the first direction between the common source line and the second dummy channel structure.

20 Claims, 33 Drawing Sheets

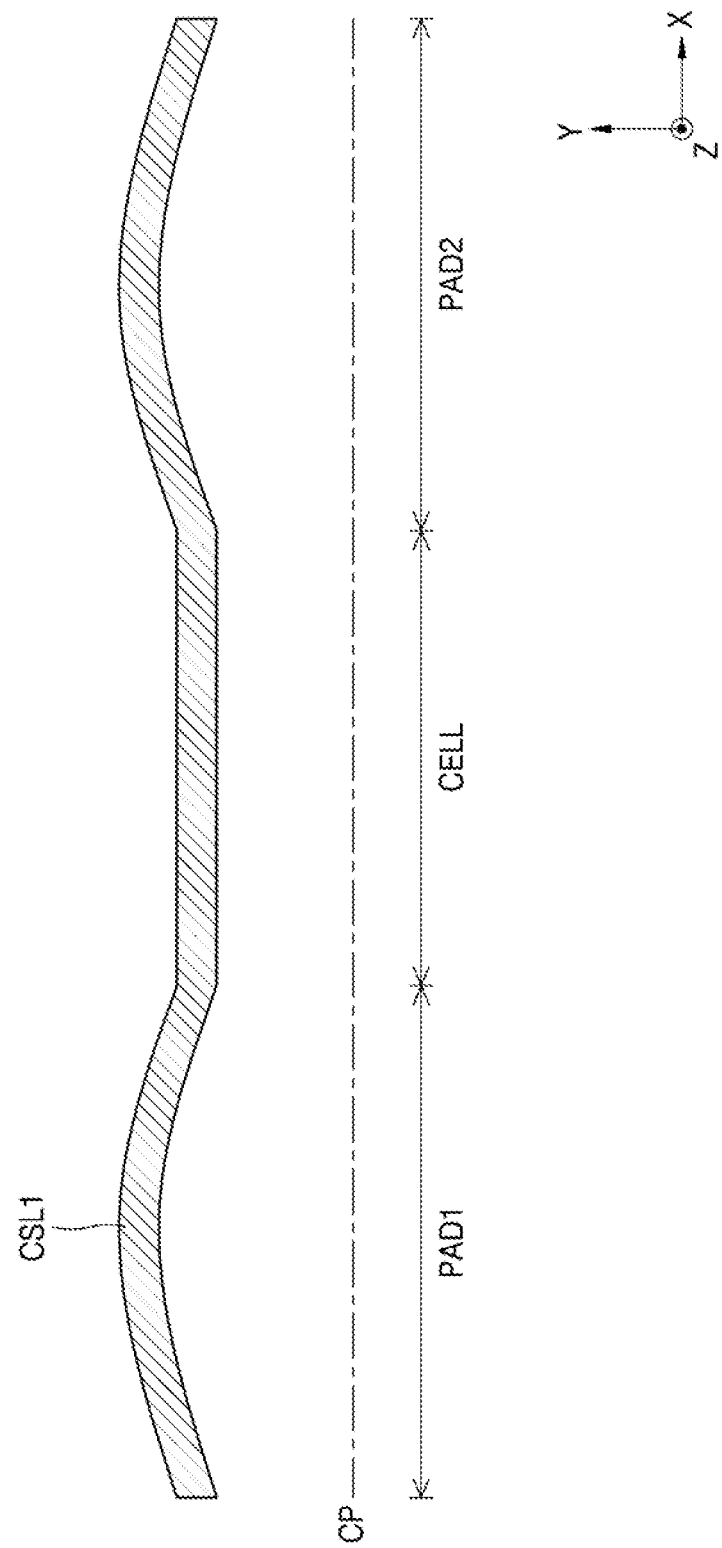

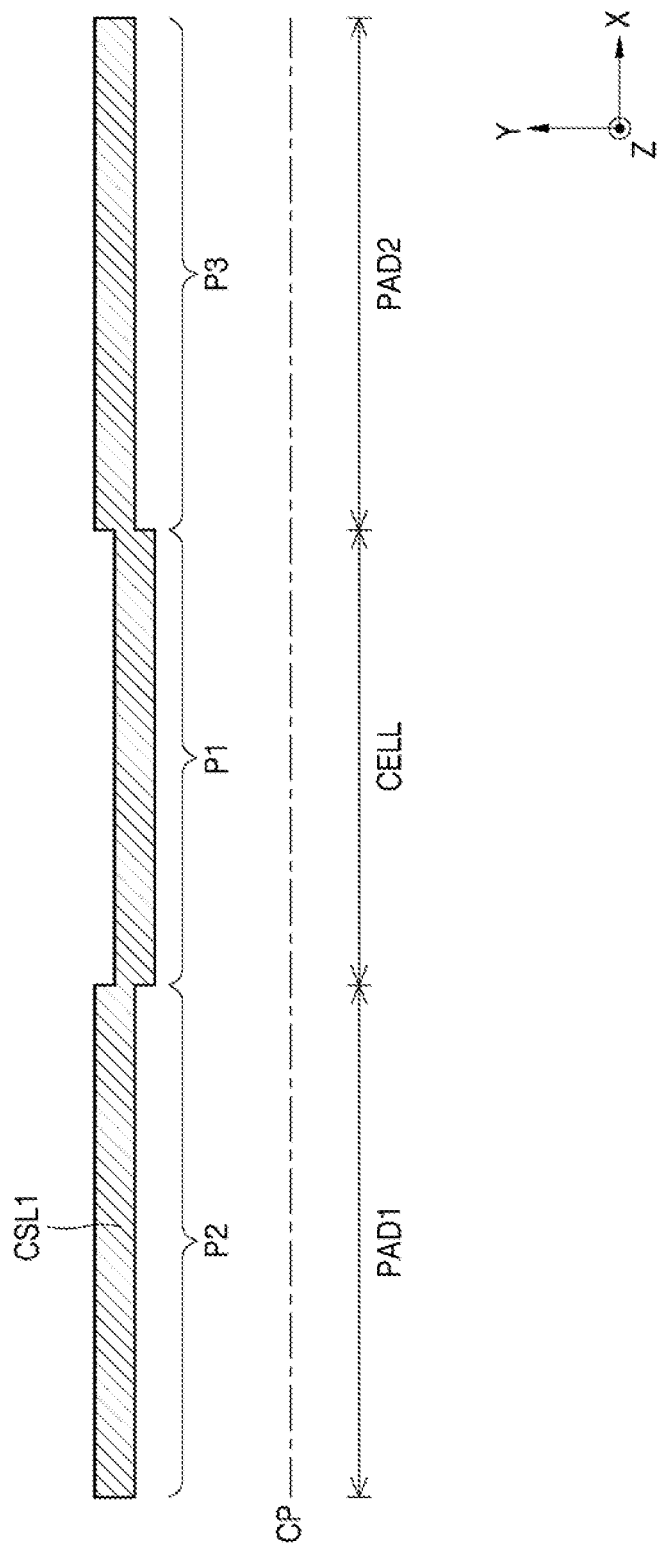

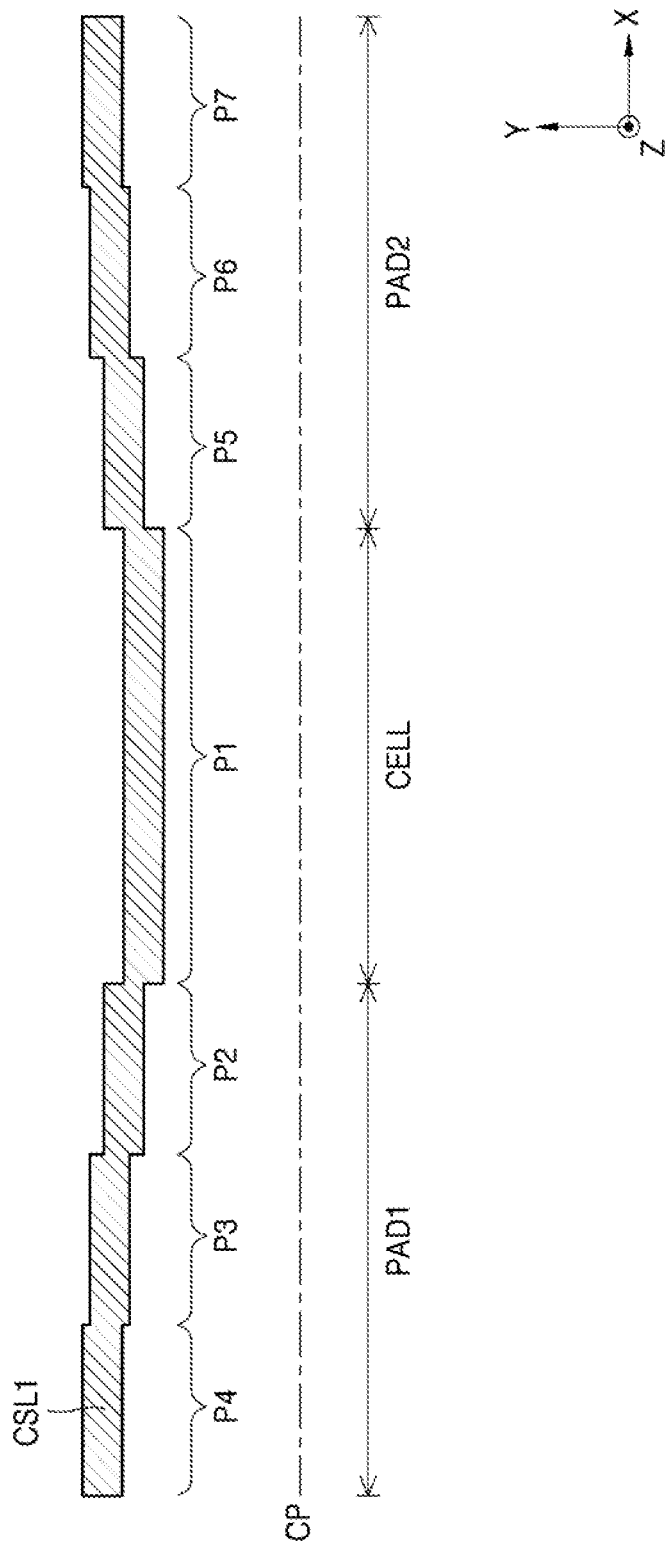

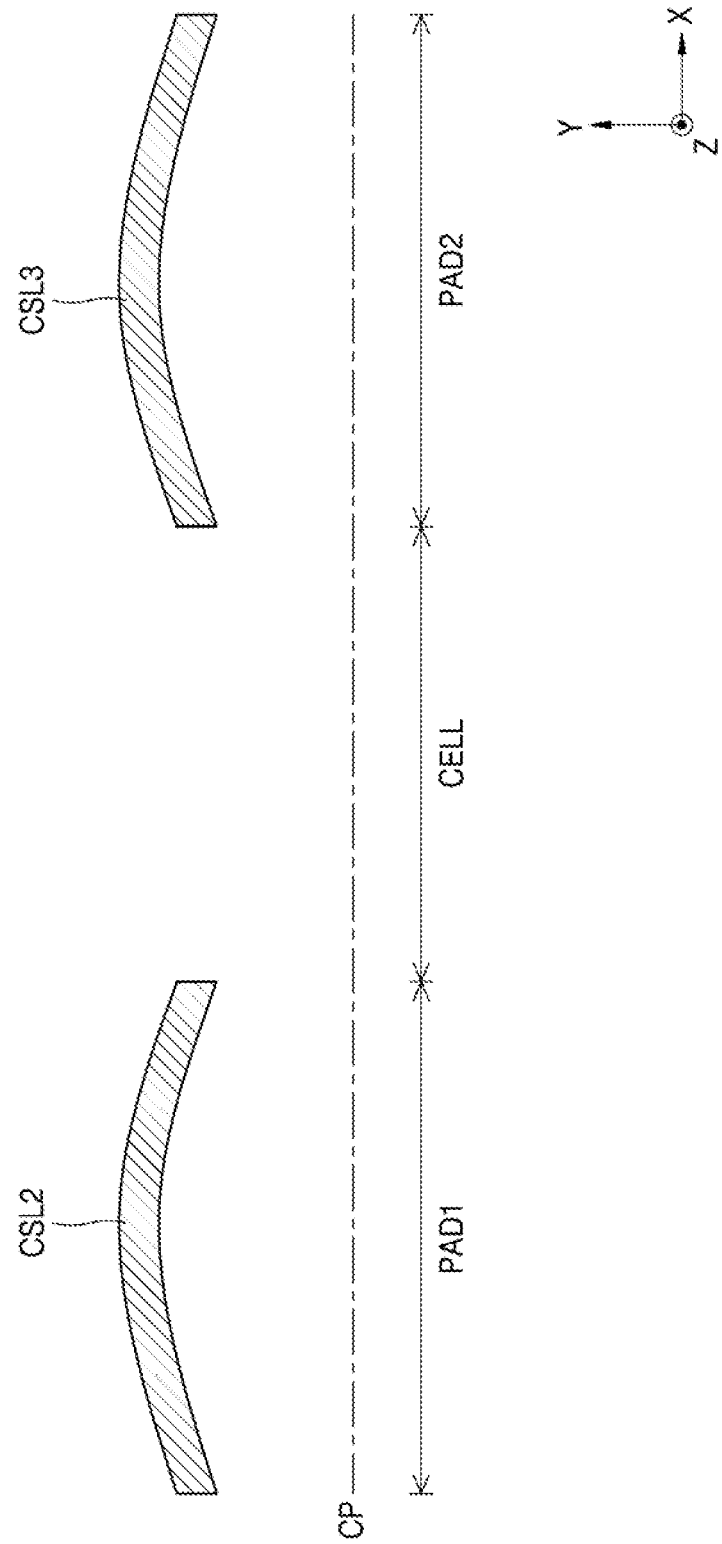

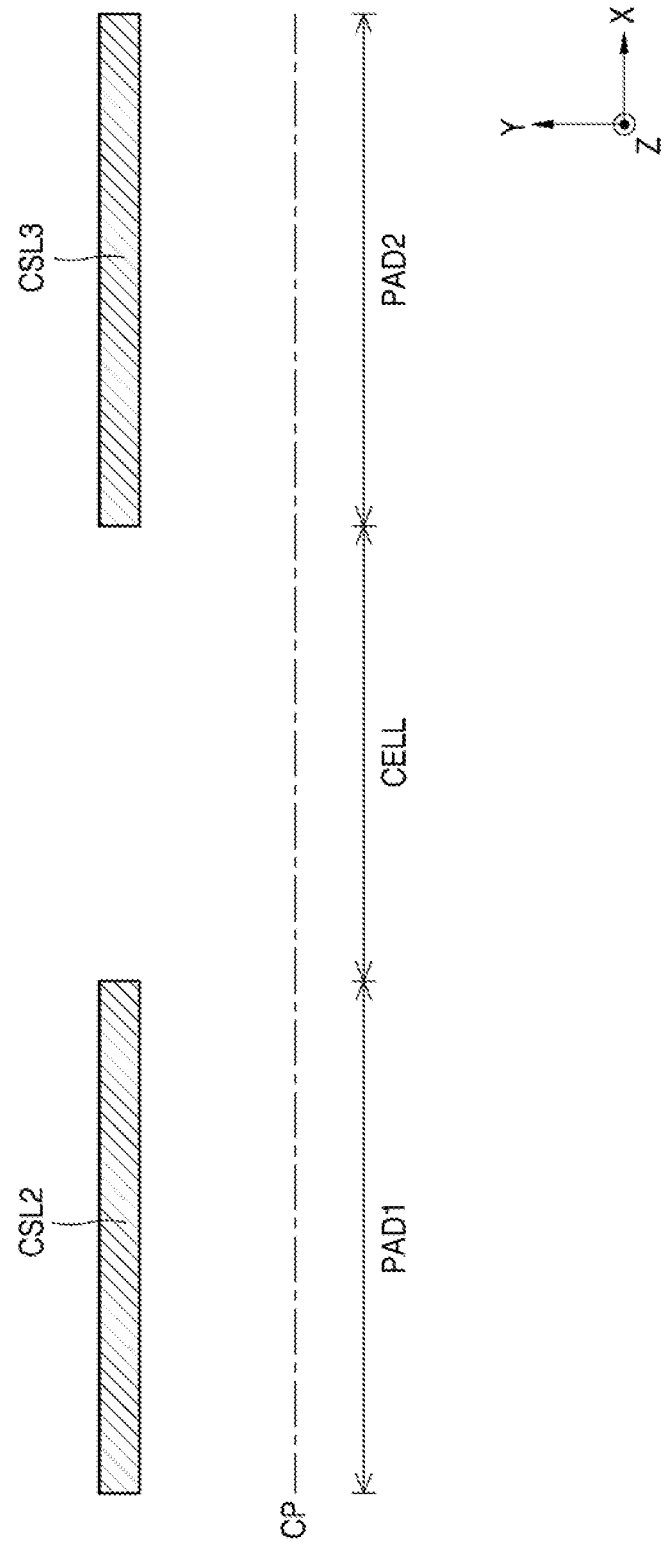

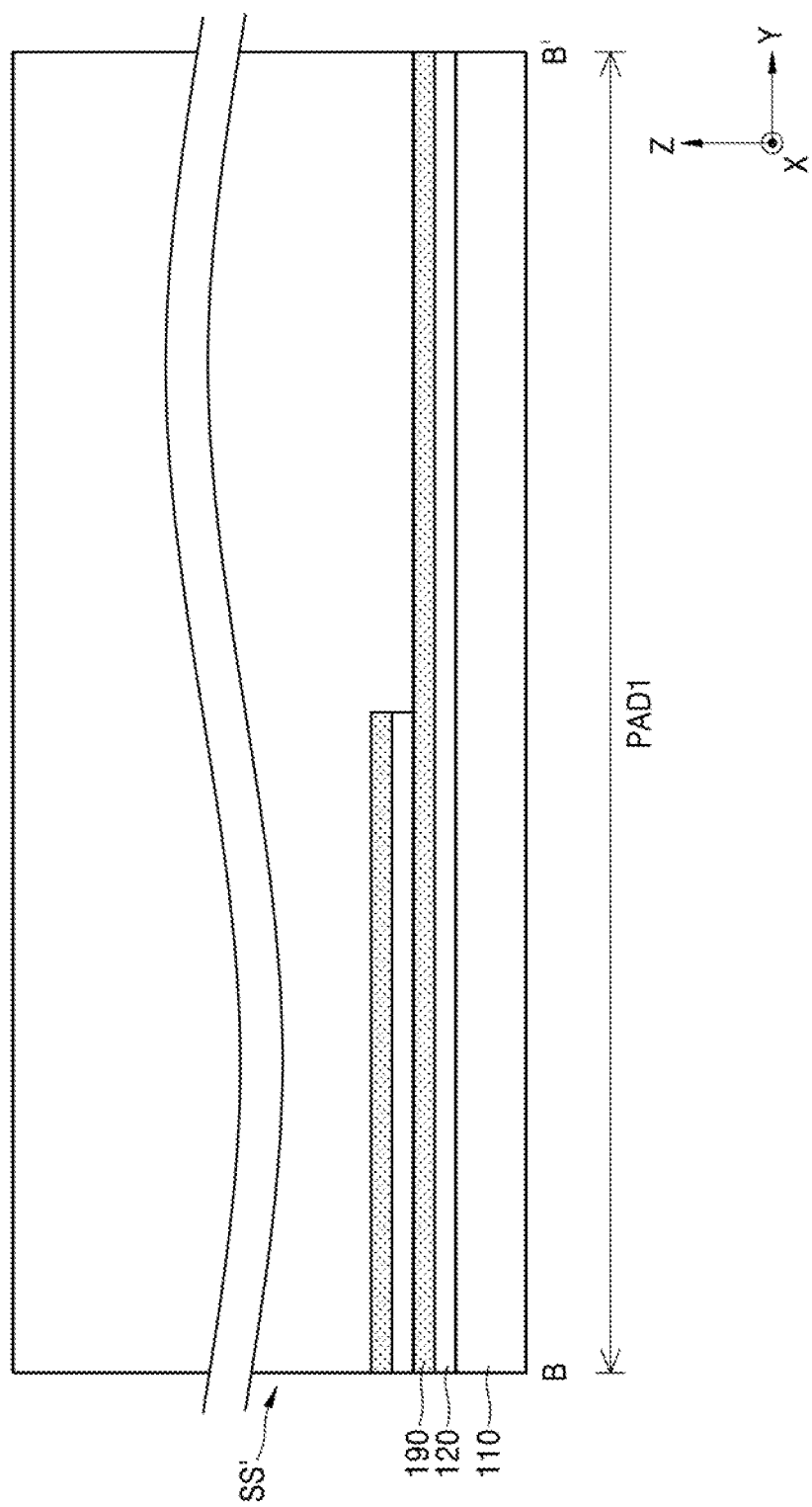

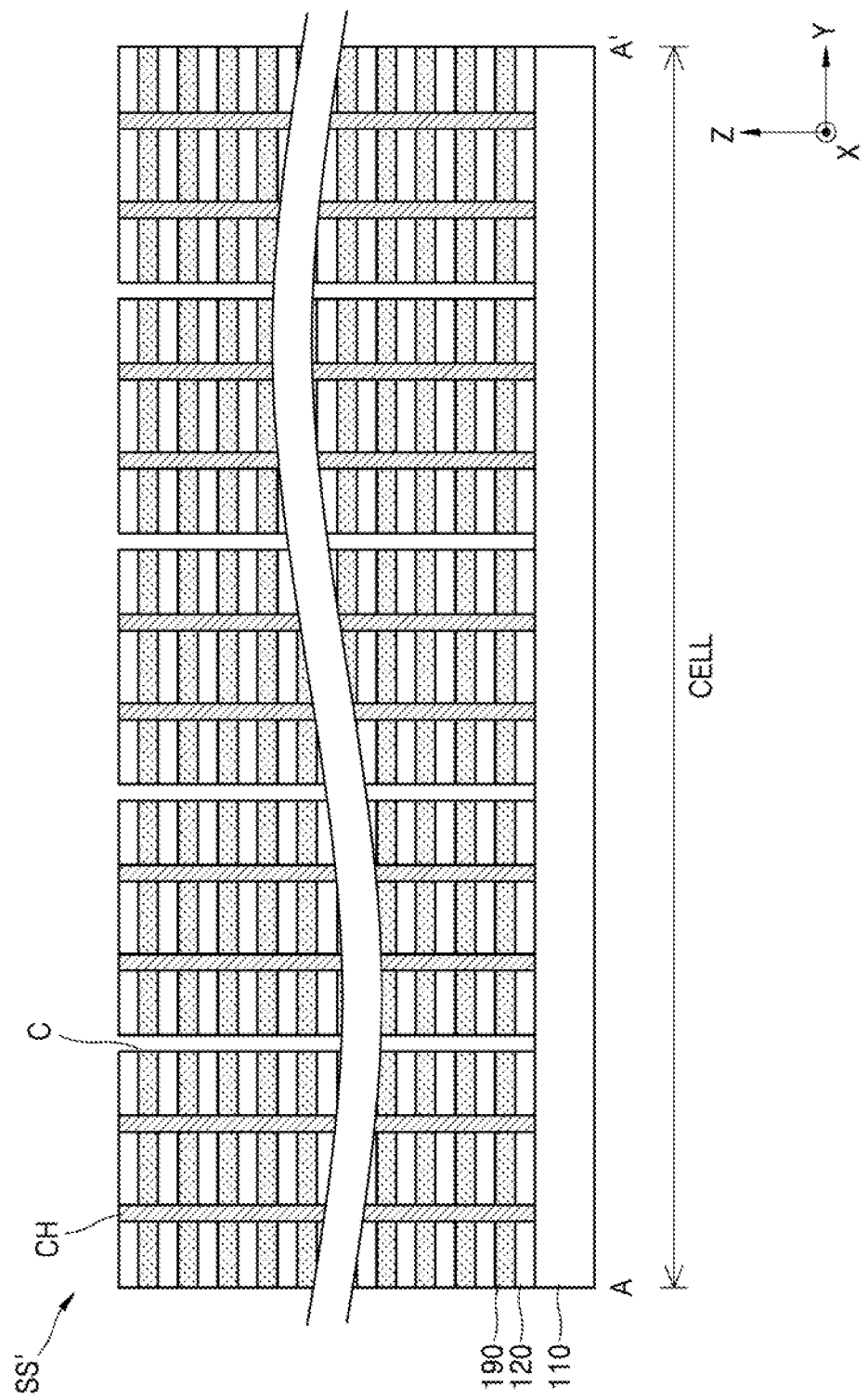

THREE-DIMENSIONAL SEMICONDUCTOR DEVICE

CROSS-REFERENCE TO RELATED APPLICATION

This application claims the benefit under 35 U.S.C. § 119 of Korean Patent Application No. 10-2018-0108513, filed on Sep. 11, 2018, in the Korean Intellectual Property Office, the disclosure of which is incorporated by reference herein in its entirety.

TECHNICAL FIELD

The present inventive concept relates to a three-dimensional semiconductor device, and more particularly, to a three-dimensional non-volatile semiconductor memory device.

DISCUSSION OF RELATED ART

The continuing trend towards miniaturization to produce light, thin, and small electronic products with large capacity has led to an increase in demand for highly integrated semiconductor memory devices. To meet this demand, three-dimensional semiconductor memory devices have been developed. A three-dimensional semiconductor memory device includes layers stacked on a substrate and a channel structure passing through the stacked layers. The number of memory cells per unit area of the substrate may be increased by increasing the number of layers stacked on the substrate. However, due to the increase in the number of layers stacked, an internal stress may occur in the stacked structure during the manufacturing process resulting in the formation of various defects, which may accordingly degrade the reliability of the three-dimensional semiconductor memory device.

SUMMARY

The present inventive concept provides a three-dimensional semiconductor device that prevents a bridge from occurring between a common source line and a word line contact, and a method of manufacturing the three-dimensional semiconductor device.

According to an aspect of the present inventive concept, there is provided a three-dimensional semiconductor device including: a substrate; a stacked structure disposed on the substrate, the stacked structure including a cell region and a pad region; a first channel structure passing through the cell region; a second channel structure passing through the cell region and spaced apart from the first channel structure in a first direction; a first dummy channel structure passing through the pad region; a second dummy channel structure passing through the pad region and spaced apart from the first dummy channel structure in the first direction; and a common source line passing between the first channel structure and the second channel structure and between the first dummy channel structure and the second dummy channel structure, in which a distance in the first direction between the common source line and the first channel structure is equal to a distance in the first direction between the common source line and the second channel structure, and a distance in the first direction between the common source line and the first dummy channel structure is different from a distance in the first direction between the common source line and the second dummy channel structure.

According to another aspect of the present inventive concept, there is provided a three-dimensional semiconductor device including: a stacked structure disposed on a substrate and including a first pad region, a second pad region spaced apart from the first pad region in a first direction, and a cell region interposed between the first pad region and the second pad region; and a first common source line crossing the first pad region, the cell region, and the second pad region, in which the first common source line in the first pad region and the second pad region is parallel to a vertical direction perpendicular to a main surface of the substrate, and the first common source line in the cell region is tilted with respect to the vertical direction.

According to another aspect of the present inventive concept, there is provided a method of manufacturing a three-dimensional semiconductor device, the method including: forming a stacked structure in which a plurality of insulating layers and a plurality of sacrificial layers are alternately stacked on a substrate; forming first and second channel structures passing through a cell region of the stacked structure and spaced apart from each other in a horizontal direction parallel to a main surface of the substrate, and first and second dummy channel structures passing through a pad region of the stacked structure and spaced apart from each other in the horizontal direction; forming a word line cut that cuts between the first channel structure and the second channel structure and between the first dummy channel structure and the second dummy channel structure; removing the plurality of sacrificial layers; filling spaces, from which the plurality of sacrificial layers are removed, with a plurality of conductive layers; and forming a common source line to fill the word line cut, in which a distance in the horizontal direction between the word line cut and the first channel structure is equal to a distance in the horizontal direction between the word line cut and the second channel structure, and a distance in the horizontal direction between the word line cut and the first dummy channel structure is different from a distance in the horizontal direction between the word line cut and the second dummy channel structure.

BRIEF DESCRIPTION OF THE DRAWINGS

Exemplary Embodiments of the present inventive concept will be more clearly understood from the following detailed description taken in conjunction with the accompanying drawings, in which:

FIGS. 2A to 2D are enlarged views of a first common source line each according to an exemplary embodiment of the present inventive concept;

FIGS. 3A to 3D are enlarged views of a second common source line and a third common source line, each according to an exemplary embodiment of the present inventive concept;

FIGS. 10B to 14B are cross-sectional views illustrating a method of manufacturing a semiconductor device, according to an exemplary embodiment of the present inventive concept;

Figure 1:
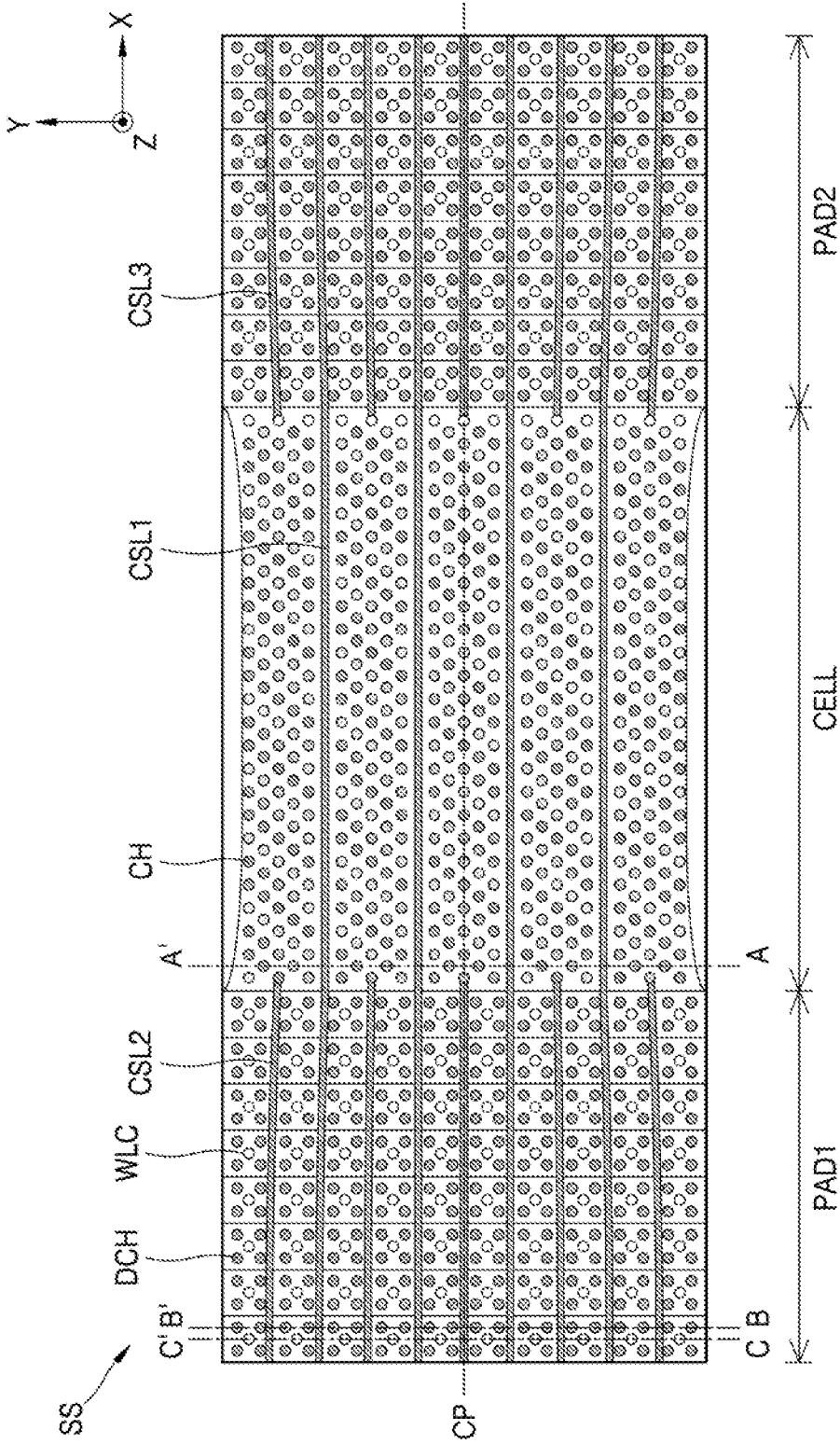
FIG. 1 is a plan view of a three-dimensional semiconductor device according to an exemplary embodiment of the present inventive concept.

Since the drawings in FIGS. 1-16 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

FIG. 1 is a plan view of a three-dimensional semiconductor device according to an exemplary embodiment of the present inventive concept.

Referring to FIG. 1, a stacked structure SS may include a first pad region PAD1, a cell region CELL, and a second pad region PAD2. The first pad region PAD1 and the second pad region PAD2 may be spaced apart from each other in a first direction X, which is also referred to as a horizontal direction X, parallel to a main surface of a substrate 110 (see FIGS. 5 to 7) and the cell region CELL may be interposed between the first pad region PAD1 and the second pad region PAD2. Hereinafter, a center plane CP refers to a plane extending in the first direction X and parallel to a third direction Z, which is also referred to as a vertical direction Z, perpendicular to the main surface of the substrate 110 (see FIGS. 5 to 7) and bisecting the stacked structure SS.

A first common source line CSL1 may cross the first pad region PAD1, the cell region CELL, and the second pad region PAD2. The second common source line CSL2 may cross the first pad region PAD1. The third common source line CSL3 may cross the second pad region PAD2.

A plurality of channel structures CH may each pass through the cell region CELL. For example, the plurality of channel structures CH may each pass through the cell region CELL of the stacked structure SS by extending in the third direction Z (the vertical direction Z), but may not be in parallel with the third direction Z. A plurality of dummy channel structures DCH may each pass through the first pad region PAD1 or the second pad region PAD2. For example, the plurality of dummy channel structures CH may each pass through the first pad region PAD1 or the second pad region PAD2 of the stacked structure SS by extending in the third direction Z (the vertical direction Z). A plurality of word line contacts WLC may each be placed on the first pad region PAD1 or the second pad region PAD2. For example, the plurality of word line contacts WLC may each extend in the third direction Z (the vertical direction Z), but may not pass through the first pad region PAD1 or the second pad region PAD2 of the stacked structure SS. In an exemplary embodiment of the present inventive concept, each of the plurality of word line contacts WLC may be surrounded by four dummy channel structures DCH. The arrangement of the plurality of channel structures CH and the plurality of dummy channel structures DCH, shown in FIG. 1, is merely an example and may be variously modified.

The first common source line CSL1 may pass between dummy channel structures DCH of the first pad region PAD1, between channel structures CH of the cell region CELL, and between dummy channel structures DCH of the second pad region PAD2. The second common source line CSL2 may pass between dummy channel structures DCH of the first pad region PAD1. The third common source line CSL3 may pass between dummy channel structures DCH of the second pad region PAD2. The relative arrangements of the first to third common source lines CSL1, CSL2, and CSL3, the plurality of channel structures CH, and the plurality of dummy channel structures DCH are described in more detail with reference to FIGS. 4A to 4C.

FIGS. 2A to 2D are enlarged views of a first common source line each according to an exemplary embodiment of the present inventive concept. FIGS. 3A to 3D are enlarged views of a second common source line and a third common source line each according to an exemplary embodiment of the present inventive concept.

Figure 2A:
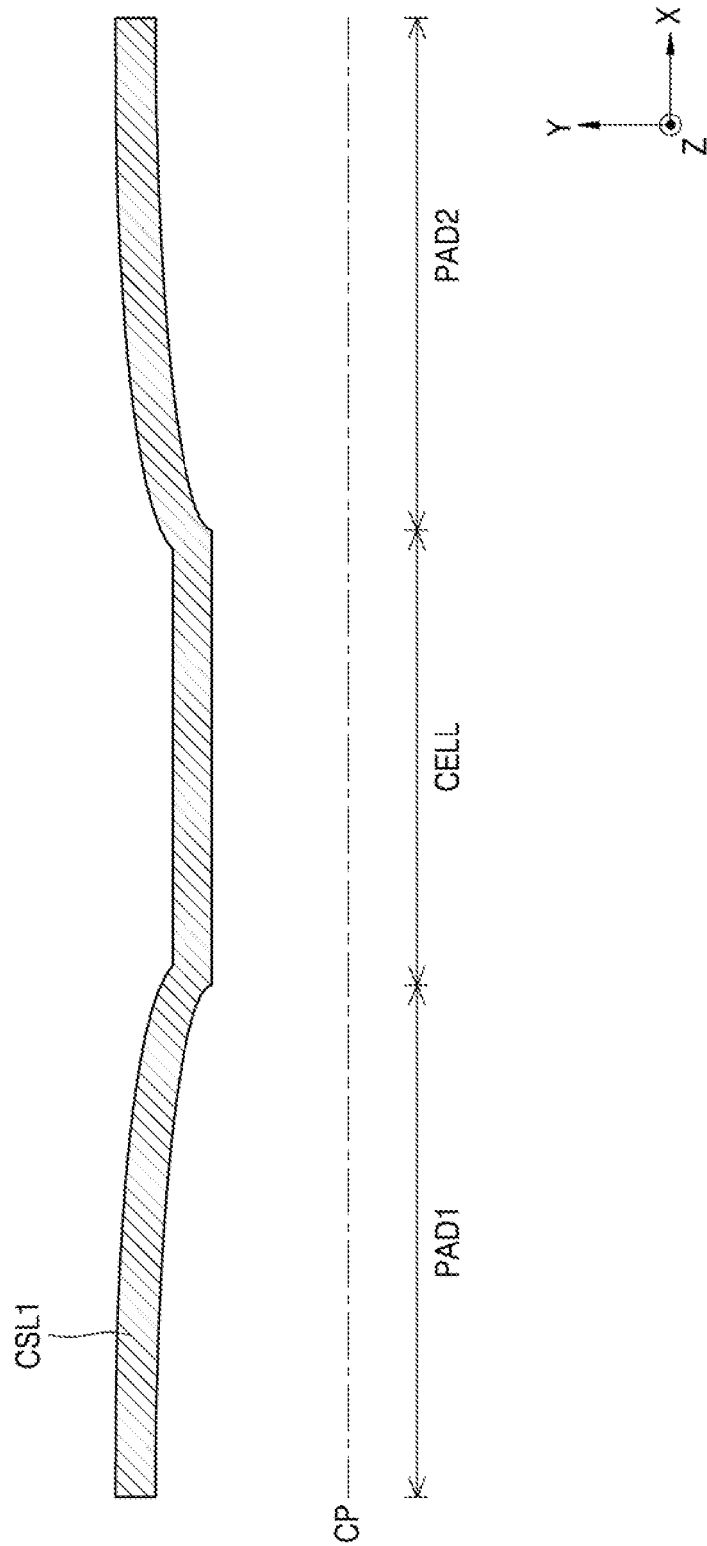

Referring to FIG. 2A, the distance in a second direction Y, which is also referred to as a horizontal direction Y, parallel to the main surface of the substrate 110 (see FIGS. 5 to 7) between the first common source line CSL1 and the center plane CP in the cell region CELL may be constant. The distance in the second direction Y between the first common source line CSL1 and the center plane CP in the first pad region PAD1 and the second pad region PAD2 may vary depending on the position in the first direction X. For example, the distance in the second direction Y between the first common source line CSL1 and the center plane CP in the first pad region PAD1 and the second pad region PAD2 may increase as the position in the first direction X gets farther away from the cell region CELL. In an exemplary embodiment of the present inventive concept, the distance in the second direction Y between the first common source line CSL1 and the center plane CP may increase first then converge to a constant value as the position in the first direction X gets farther away from the cell region CELL. A cross section, which is perpendicular to the third direction Z, of the first common source line CSL1 in the cell region CELL may be a straight line parallel to the first direction X. At least a portion of a cross section of the first common source line CSL1 is curved, with the cross section being perpendicular to the third (vertical) direction Z. For example, a cross section, which is perpendicular to the third direction Z, of the first common source line CSL1 in the first pad region PAD1 and the second pad region PAD2 may be curved. The distance in the second direction Y between the first common source line CSL1 and the center plane CP in the first pad region PAD1 and the second pad region PAD2 may each have a maximum value at an end of the first common source line CSL1 located at an end of each of the first pad region PAD1 and the second pad region PAD2.

Figure 3A:
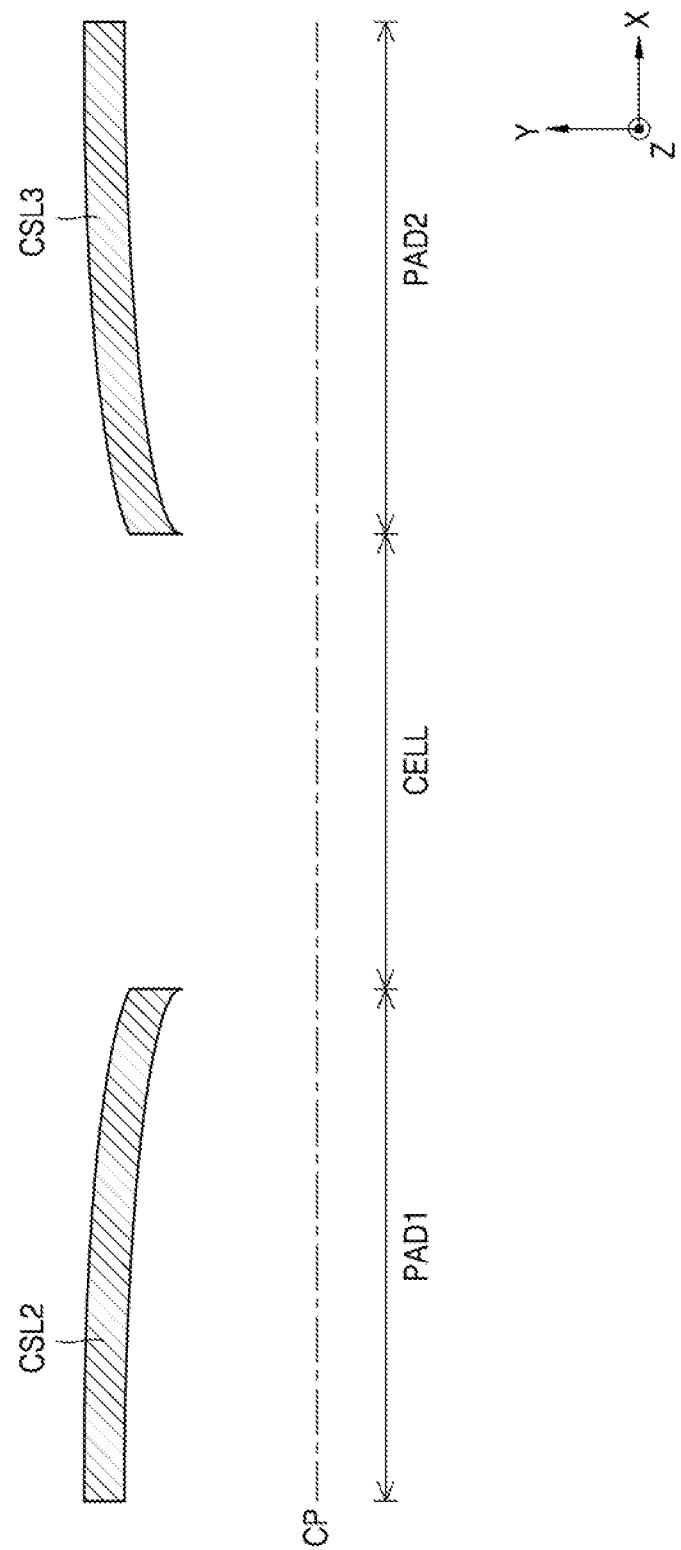

Referring to FIG. 3A, the second common source line CSL2 may cross the first pad region PAD1 in the first direction X, and the distance in the second direction Y between the second common source line CSL2 and the center plane CP may vary depending on the position in the first direction X. For example, the distance in the second direction Y between the second common source line CSL2 and the center plane CP may increase as the position in the first direction X gets farther away from the cell region CELL. In an exemplary embodiment of the present inventive concept, the distance in the second direction Y between the second common source line CSL2 and the center plane CP may increase then converge to a constant value as the position in the first direction X gets farther away from the cell region CELL. The distance in the second direction Y between the second common source line CSL2 and the center plane CP has a maximum value at an end of the second common source line CSL2 located at an end of the first pad region PAD1. A cross section, which is perpendicular to the third direction Z, of the second common source line CSL2 may be curved.

The third common source line CSL3 may cross the second pad region PAD2 in the first direction X, and the distance in the second direction Y between the third common source line CSL3 and the center plane CP may vary depending on the position in the first direction X. For example, the distance in the second direction Y between the third common source line CSL3 and the center plane CP may increase as the position in the first direction X gets farther away from the cell region CELL. In an exemplary embodiment of the present inventive concept, the distance in the second direction Y between the third common source line CSL3 and the center plane CP may increase first then converge to a constant value as the position in the first direction X gets farther away from the cell region CELL. The distance in the second direction Y between the third common source line CSL3 and the center plane CP may have a maximum value at an end of the third common source line CSL3 located at an end of the second pad region PAD2. A cross section, which is perpendicular to the third direction Z, of the third common source line CSL3 may be curved.

Referring to FIG. 2B, the distance in the second direction Y between the first common source line CSL1 and the center plane CP in the cell region CELL may be constant. The distance in the second direction Y between the first common source line CSL1 and the center plane CP in the first pad region PAD1 and the second pad region PAD2 may increase and then decrease as the position in the first direction X gets farther away from the cell region CELL. The distance in the second direction Y between the first common source line CSL1 and the center plane CP may have a maximum value at any point in the center of each the first pad region PAD1 and the second pad region PAD2 in the first direction X.

Referring to FIG. 3B, the distance in the second direction Y between the second common source line CSL2 and the center plane CP may increase and then decrease as the position in the first direction X gets farther away from the cell region CELL. The distance in the second direction Y between the second common source line CSL2 and the center plane CP may have a maximum value at any point in the center of the first pad region PAD1 in the first direction X.

The distance in the second direction Y between the third common source line CSL3 and the center plane CP may increase and then decrease as the position in the first direction X gets farther away from the cell region CELL. The distance in the second direction Y between the third common source line CSL3 and the center plane CP may have a maximum value at any point in the center of the second pad region PAD2 in the first direction X.

Referring to FIG. 2C, the first common source line CSL1 may include a plurality of portions extending in the first direction X. That is, the first common source line CSL1 may include a first portion P1 in the cell region CELL, a second portion P2 in the first pad region PAD1, and a third portion P3 in the second pad region PAD2. Each of the portions of the first common source line CSL1 has a constant distance from the center plane CP in the second direction Y. That is, a cross section, which is perpendicular to the third direction Z, of each portion of the first common source line CSL1 may be straight, for example, may be a straight line parallel to the first direction X. The distance between the first portion P1 of the first common source line CSL1 and the center plane CP may be smaller than the distance between the second portion P2 of the first common source line CSL1 and the center plane CP. Similarly, the distance between the first portion P1 of the first common source line CSL1 and the center plane CP may be smaller than the distance between the third portion P3 of the first common source line CSL1 and the center plane CP.

Referring to FIG. 3C, the second common source line CSL2 and the third common source line CSL3 may extend in the first direction X. A cross section, which is perpendicular to the third direction Z, of the second common source line CSL2 and a cross section, which is perpendicular to the third direction Z, of the third common source line CSL3 may be straight, for example, may each be a straight line parallel to the first direction X.

Referring to FIG. 2D, the first common source line CSL1 may include a first portion P1 in the cell region CELL1, second to fourth portions P2 to P4 sequentially arranged from the first portion P1 in the first pad region PAD1, and fifth to seventh portions P5 to P7 sequentially arranged from the first portion P1 in the second pad regions PAD2. However, the present inventive concept is not limited thereto. For example, unlike in FIG. 2D, the first common source line CSL1 may include five or more than seven portions. Each of the first to seventh portions P1 to P7 may extend in the first direction X, and may have a constant distance from the center plane CP in the second direction Y. That is, a cross section, which is perpendicular to the third direction Z, of each portion of the first common source line CSL1 may be straight, for example, may be a straight line parallel to the first direction X.

In an exemplary embodiment of the present inventive concept, a portion farther away from the cell region CELL may be farther away from the center plane CP relative to other portions which are closer to the cell region CELL. For example, the second portion P2 may be farther away from the center plane CP than the first portion P1, the third portion P3 may be farther away from the center plane CP than the second portion P2, the fourth portion P4 may be farther away from the center plane CP than the third portion P3, the fifth portion P5 may be farther away from the center plane CP than the first portion P1, the sixth portion P6 may be farther away from the center plane CP than the fifth portion P5, and the seventh portion P7 may be farther away from the center plane CP than the sixth portion P6. However, the present inventive concept is not limited thereto. For example, in an exemplary embodiment of the present inventive concept, unlike in FIG. 2D, in a local region, a portion farther away from the cell region CELL may be closer to the center plane CP. For example, the fourth portion P4 may be closer to the center plane CP than the third portion P3.

Figure 3D:
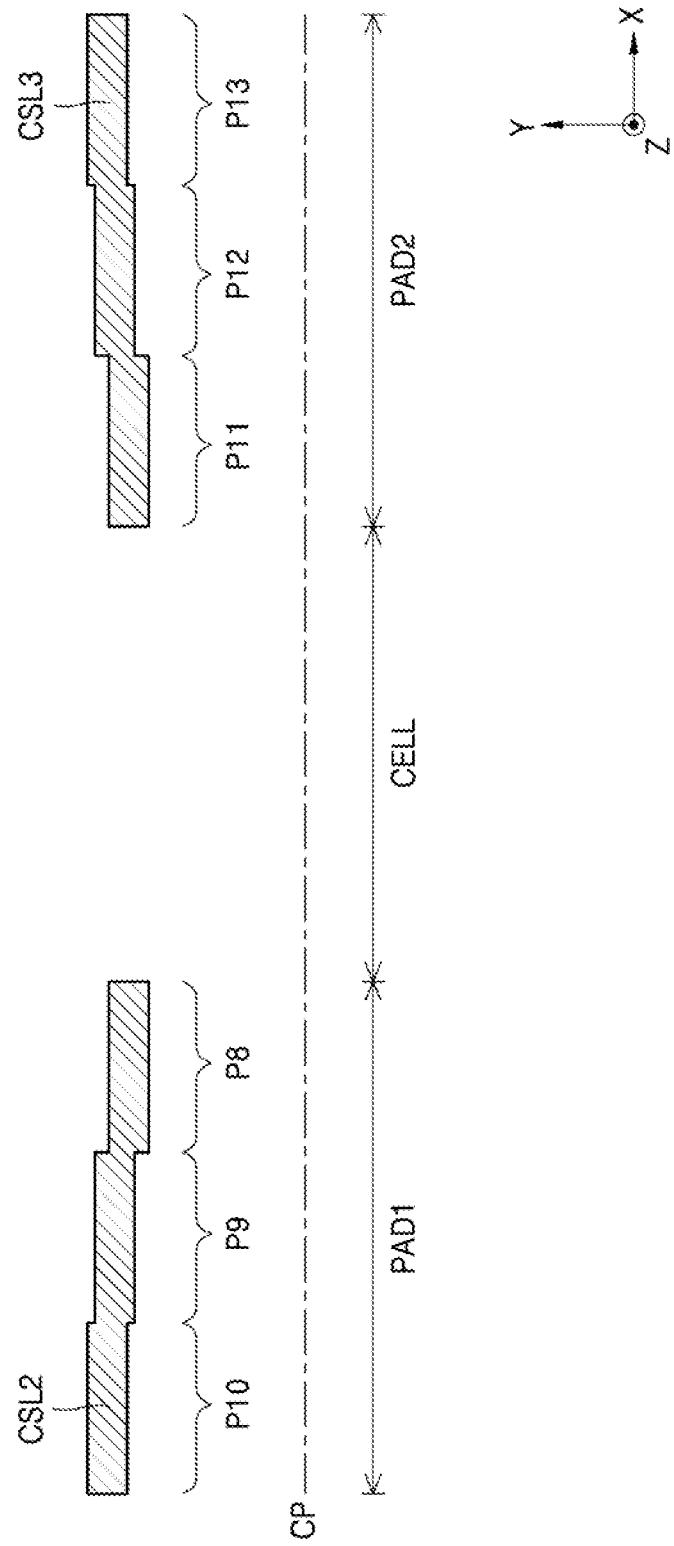

Referring to FIG. 3D, the second common source line CSL2 may include a plurality of portions, that is, eighth to tenth portions P8 to P10 sequentially arranged from the border of the cell region CELL in the first pad region PAD1. Each of the eighth to tenth portions P8 to P10 may extend in the first direction X, and may have a constant distance from the center plane CP in the second direction Y. That is, a cross section, which is perpendicular to the third direction Z, of each portion of the second common source line CSL2 may be straight, for example, may be a straight line parallel to the first direction X. The distances between the eighth to tenth portions P8 to P10 and the center plane CP may be different from each other. For example, a portion farther away from the cell region CELL may be farther away from the center plane CP. That is, the ninth portion P9 may be farther away from the center plane CP than the eighth portion P8, and the tenth portion P10 may be farther away from the center plane CP than the ninth portion P9. However, the present inventive concept is not limited thereto. For example, in an exemplary embodiment of the present inventive concept, unlike in FIG. 31), in a local region, a portion farther away from the cell region CELL may be closer to the center plane CP. For example, the tenth portion P10 may be closer to the center plane CP than the ninth portion P9.

The third common source line CSL3 may include a plurality of portions, that is, eleventh to thirteenth portions P11 to P13 sequentially arranged from the border of the cell region CELL in the second pad region PAD2. Each of the eleventh to thirteenth portions P11 to P13 may extend in the first direction X, and may have a constant distance from the center plane CP in the second direction Y. That is, a cross section, which is perpendicular to the third direction Z, of each portion of the third common source line CSL3 may be straight, for example, may be a straight line parallel to the first direction X. The distances between the eleventh to thirteenth portions P11 to P13 and the center plane CP may be different from each other. For example, a portion farther away from the cell region CELL may be farther away from the center plane CP. That is, the twelfth portion P12 may be farther away from the center plane CP than the eleventh portion P11 and the thirteenth portion P13 may be farther away from the center plane CP than the twelfth portion P12. However, the present inventive concept is not limited thereto. For example, in an exemplary embodiment of the present inventive concept, unlike in FIG. 3D, in a local region, a portion farther from the cell region CELL may be closer to the center plane CP. For example, the thirteenth portion P13 may be closer to the center plane CP than the twelfth portion P12.

FIGS. 4A to 4D are enlarged views of FIG. 1.

Figure 4A:
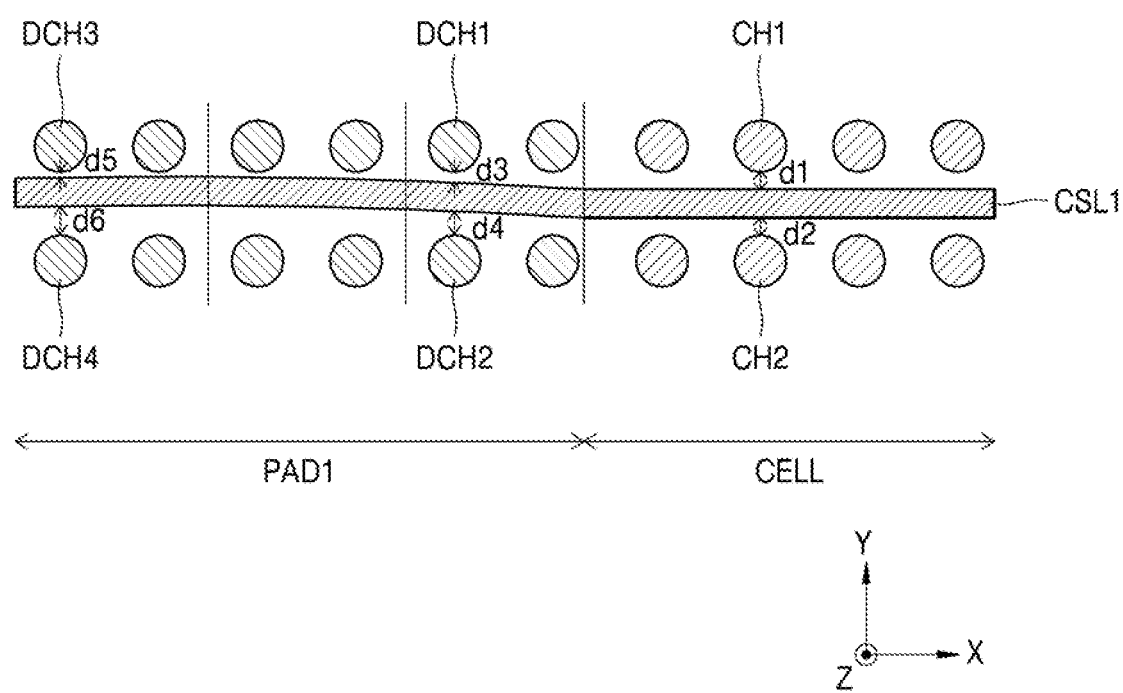
FIGS. 4A to 4D are enlarged views of FIG. 1.

Referring to FIG. 4A, a first channel structure CH1 and a second channel structure CH2 may be spaced apart from each other in the second direction Y. A first dummy channel structure DCH1 and a second dummy channel structure DCH2 may be spaced apart from each other in the second direction Y. A third dummy channel structure DCH3 and a fourth dummy channel structure DCH4 may be spaced apart from each other in the second direction Y. The first channel structure CH1, the first dummy channel structure DCH1 and the third dummy channel structure DCH3 may align with the second channel structure CH2, the second dummy channel structure DCH2 and the fourth dummy channel structure DCH4, respectively, along the second direction Y. The first common source line CSL1 may pass between the first channel structure CH1 and the second channel structure CH2 in the cell region CELL. Also, the first common source line CSL1 may pass between the first dummy channel structure DCH1 and the second dummy channel structure DCH2 and between the third dummy channel structure DCH3 and the fourth dummy channel structure DCH4 in the first pad region PAD1.

A distance d1 in the second direction Y between the first common source line CSL1 and the first channel structure CH1 may be equal to a distance d2 in the second direction Y between the first common source line CSL1 and the second channel structure CH2. On the other hand, a distance d3 in the second direction Y between the first common source line CSL1 and the first dummy channel structure DCH1 may be different from a distance d4 in the second direction Y between the first common source line CSL1 and the second dummy channel structure DCH2. In addition, a distance d5 in the second direction Y between the first common source line CSL1 and the third dummy channel structure DCH3 may be different from a distance d6 in the second direction Y between the first common source line CSL1 and the fourth dummy channel structure DCH4.

In an exemplary embodiment of the present inventive concept, a difference between the distance d5 in the second direction Y between the first common source line CSL1 and the third dummy channel structure DCH3 and the distance d6 in the second direction Y between the first common source line CSL1 and the fourth dummy channel structure DCH4 may be greater than a difference between the distance d3 in the second direction Y between the first common source line CSL1 and the first dummy channel structure DCH1 and the distance d4 in the second direction Y between the first common source line CSL1 and the second dummy channel structure DCH2.

The first common source line CSL1 may be closer to one of the first dummy channel structure DCH1 and the second dummy channel structure DCH2, whichever is farther away from the center plane CP (see FIG. 1). For example, since the first dummy channel structure DCH1 is farther away from the center plane CP (see FIG. 1) than the second dummy channel structure DCH2, the first common source line CSL1 may be closer to the first dummy channel structure DCH1. Similarly, the first common source line CSL1 may be closer to one of the third dummy channel structure DCH3 and the fourth dummy channel structure DCH4, whichever is farther away from the center plane CP (see FIG. 1). For example, since the third dummy channel structure DCH3 is farther away from the center plane CP (see FIG. 1) than the fourth dummy channel structure DCH4, the first common source line CSL1 may be closer to the third dummy channel structure DCH3.

The first channel structure CH1 and the second channel structure CH2 in the cell region CELL may be mirror-symmetric with respect to the first common source line CSL1, but the first dummy channel structure DCH1 and the second dummy channel structure DCH2 in the first pad region PAD1 may not be mirror-symmetric with respect to the first common source line CSL1. As such, in the first pad region PAD1 and the second pad region PAD2, the first common source line CSL1 may be arranged in such a way that the dummy channel structures DCH are asymmetric with respect to the first common source line CSL1.

Figure 4B:
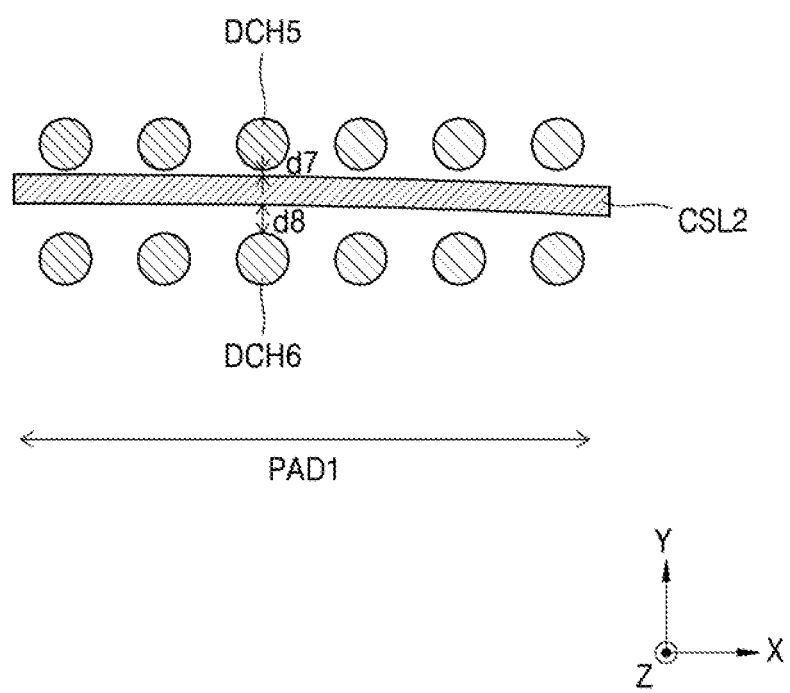

Referring to FIG. 4B, the second common source line CSL2 in the first pad region PAD1 may pass between a fifth dummy channel structure DCH5 and a sixth dummy channel structure DCH6. The fifth dummy channel structure DCH5 and the sixth dummy channel structure DCH6 may be spaced apart from each other in the second direction Y, and may be aligned along the second direction Y. A distance d7 in the second direction Y between the second common source line CSL2 and the fifth dummy channel structure DCH5 may be different from a distance d8 in the second direction Y between the second common source line CSL2 and the sixth dummy channel structure DCH6. The second common source line CSL2 may be closer to one of the fifth dummy channel structure DCH5 and the sixth dummy channel structure DCH6, whichever is farther away from the center plane CP (see FIG. 1). For example, since the fifth dummy channel structure DCH5 is farther away from the center plane CP (see FIG. 1) than sixth dummy channel structure DCH6, the second common source line CSL2 may be closer to the fifth dummy channel structure DCH5. That is, the fifth dummy channel structure CH5 and the sixth dummy channel structure CH6 in the first pad region PAD1 may not be mirror-symmetric with respect to the second common source line CSL2. As such, the second common source line CSL2 in the first pad region PAD1 may be arranged in such a way that the dummy channel structures DCH are asymmetric with respect to the second common source line CSL2.

Figure 4C:
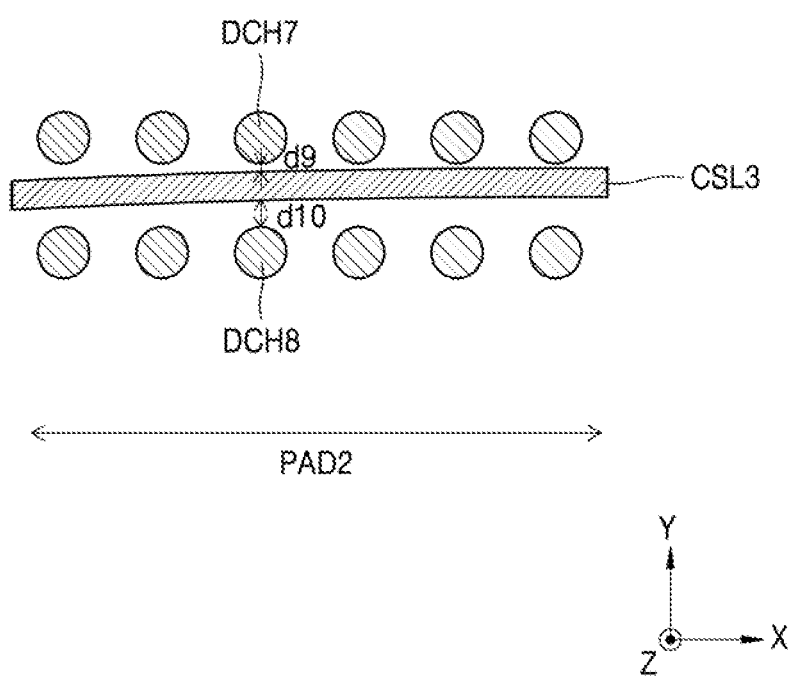

Referring to FIG. 4C, the third common source line CSL3 in the second pad region PAD2 may pass between a seventh dummy channel structure DCH7 and an eighth dummy channel structure DCH8. The seventh dummy channel structure DCH7 and the eighth dummy channel structure DCH8 may be spaced apart from each other in the second direction Y, and may be aligned along the second direction Y. A distance d9 in the second direction Y between the third common source line CSL3 and the seventh dummy channel structure DCH7 may be different from a distance d10 in the second direction Y between the third common source line CSL3 and the eighth dummy channel structure DCH8. The third common source line CSL3 may be closer to one of the seventh dummy channel structure DCH7 and the eighth dummy channel structure DCH8, whichever is farther away from the center plane CP (see FIG. 1). For example, since the seventh dummy channel structure DCH7 is farther away from the center plane CP (see FIG. 1) than the eighth dummy channel structure DCH8, the third common source line CSL3 may be closer to the seventh dummy channel structure DCH7. That is, the seventh dummy channel structure CH7 and the eighth dummy channel structure CH8 in the second pad region PAD2 may not be mirror-symmetric with respect to the third common source line CSL3. As such, the third common source line CSL3 in the second pad region PAD2 may be arranged in such a way that the dummy channel structures DCH are asymmetric with respect to the third common source line CSL3.

Figure 4D:
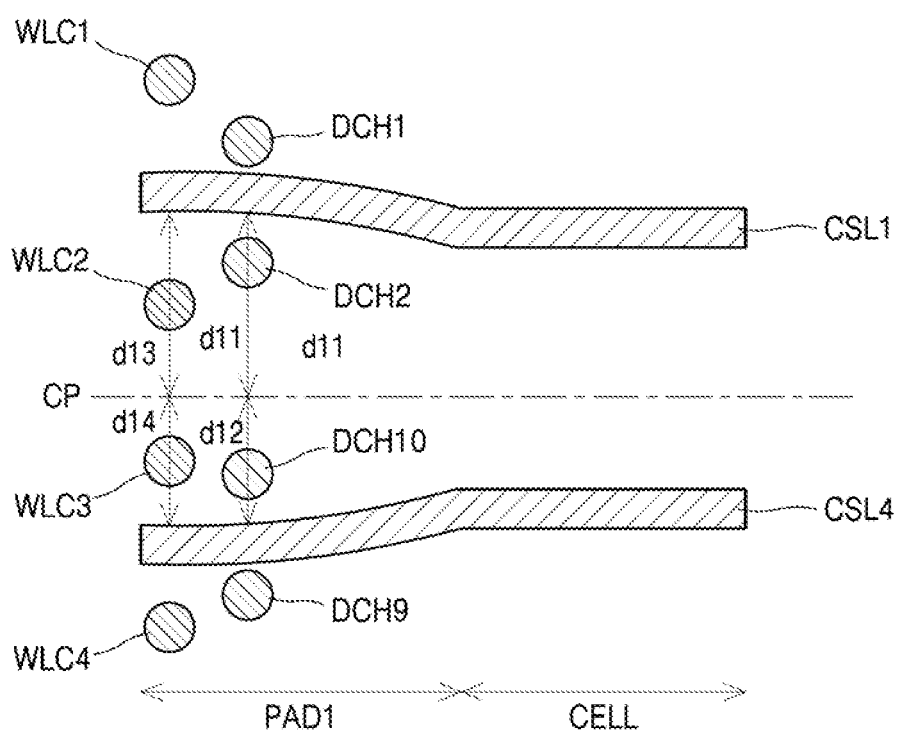

Referring to FIG. 4D, the fourth common source line CSL4 may pass between the ninth dummy channel structure DCH9 and the tenth dummy channel structure DCH10. In an exemplary embodiment of the present inventive concept, the fourth common source line CSL4 may be mirror-symmetric with the first common source line CSL1. The first dummy channel structure DCH1, the second dummy channel structure DCH2, the ninth dummy channel structure DCH9 and the tenth dummy channel structure DCH10 may align along the second direction Y, and thus may have positions different in the second direction Y and about the same in the first direction X. The first common source line CSL1 may be closer to the first dummy channel structure DCH1 which is farther away from the center plane CP than the second dummy channel structure DCH2. The fourth common source line CSL4 may be closer to the ninth dummy channel structure DCH9 which is farther away from the center plane CP than the tenth dummy channel structure DCH10. In an exemplary embodiment of the present inventive concept, a distance d11 between the center plane CP and the first common source line CSL1 at a location between the first dummy channel structure DCH1 and the second dummy channel structure DCH2 may be different from a distance d12 between the center plane CP and the fourth common source line CSL4 at a location between the ninth dummy channel structure DCH9 and the tenth dummy channel structure DCH10.

The first common source line CSL1 may pass between a first word line contact WLC1 and a second word line contact WLC2. The fourth common source line CSL4 may pass between a third word line contact WLC3 and a fourth word line contact WLC4. The first word line contact WLC1, the second word line contact WLC2, the third word line contact WLC3 and the fourth word line contact WLC4 may align along the second direction Y, and thus may have positions different in the second direction Y and about the same in the first direction X. The first common source line CSL1 may be closer to the first word line contact WLC1 which is farther away from the center plane CP than the second word line contact WLC2. The fourth common source line CSL4 may be closer to the fourth word line contact WLC4 which is farther away from the center plane CP than the third word line contact WLC3. In an exemplary embodiment of the present inventive concept, a distance d13 between the center plane CP and the first common source line CSL1 at a location between the first word line contact WLC1 and the second word line contact WLC2 may be different from a distance d14 between the center plane CP and the fourth common source line CSL4 at a location between the third word line contact WLC3 and the fourth word line contact WLC4.

Figure 5:
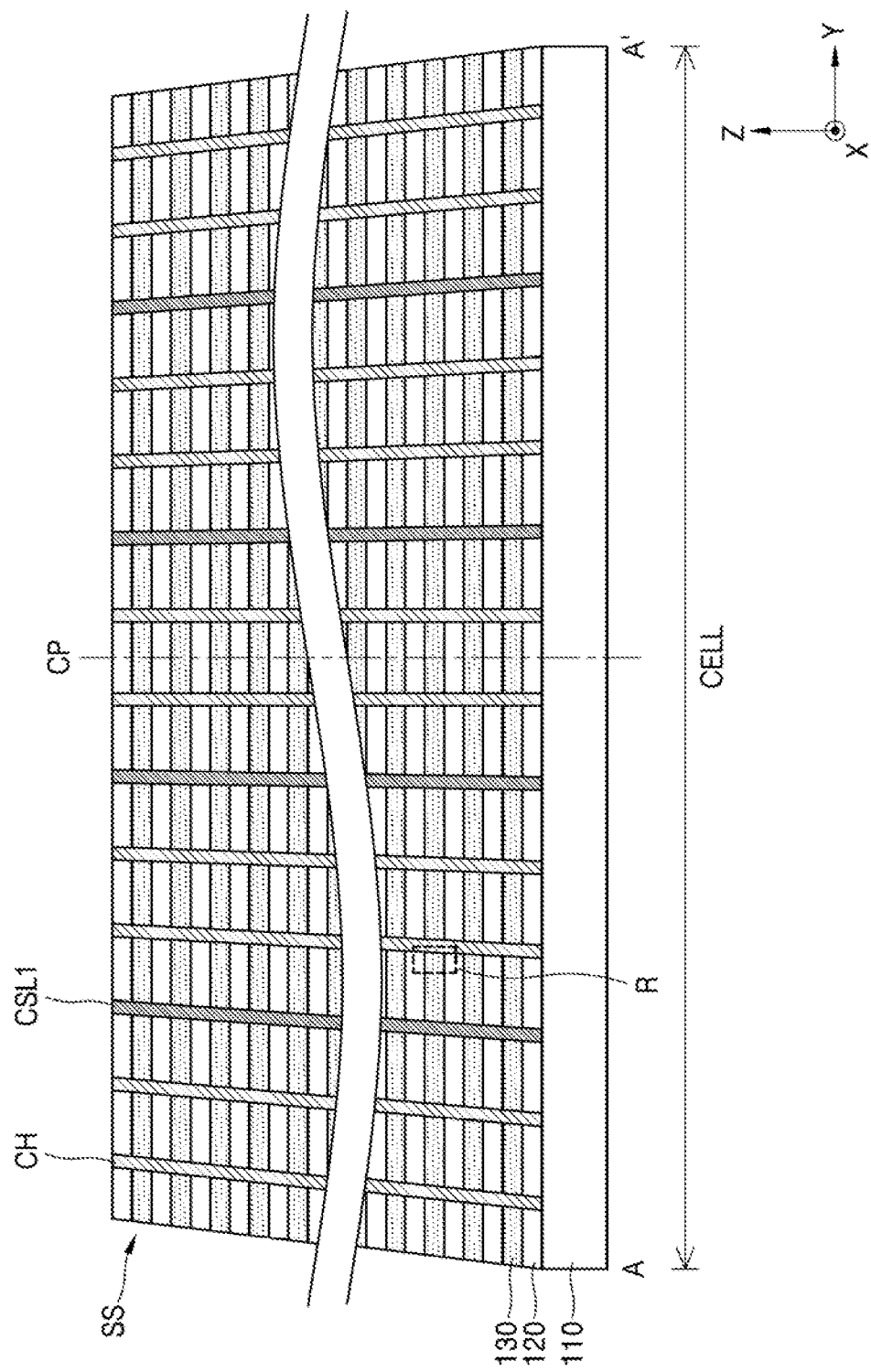
FIG. 5 is a cross-sectional view taken along line AA' of FIG. 1.
Figure 6:
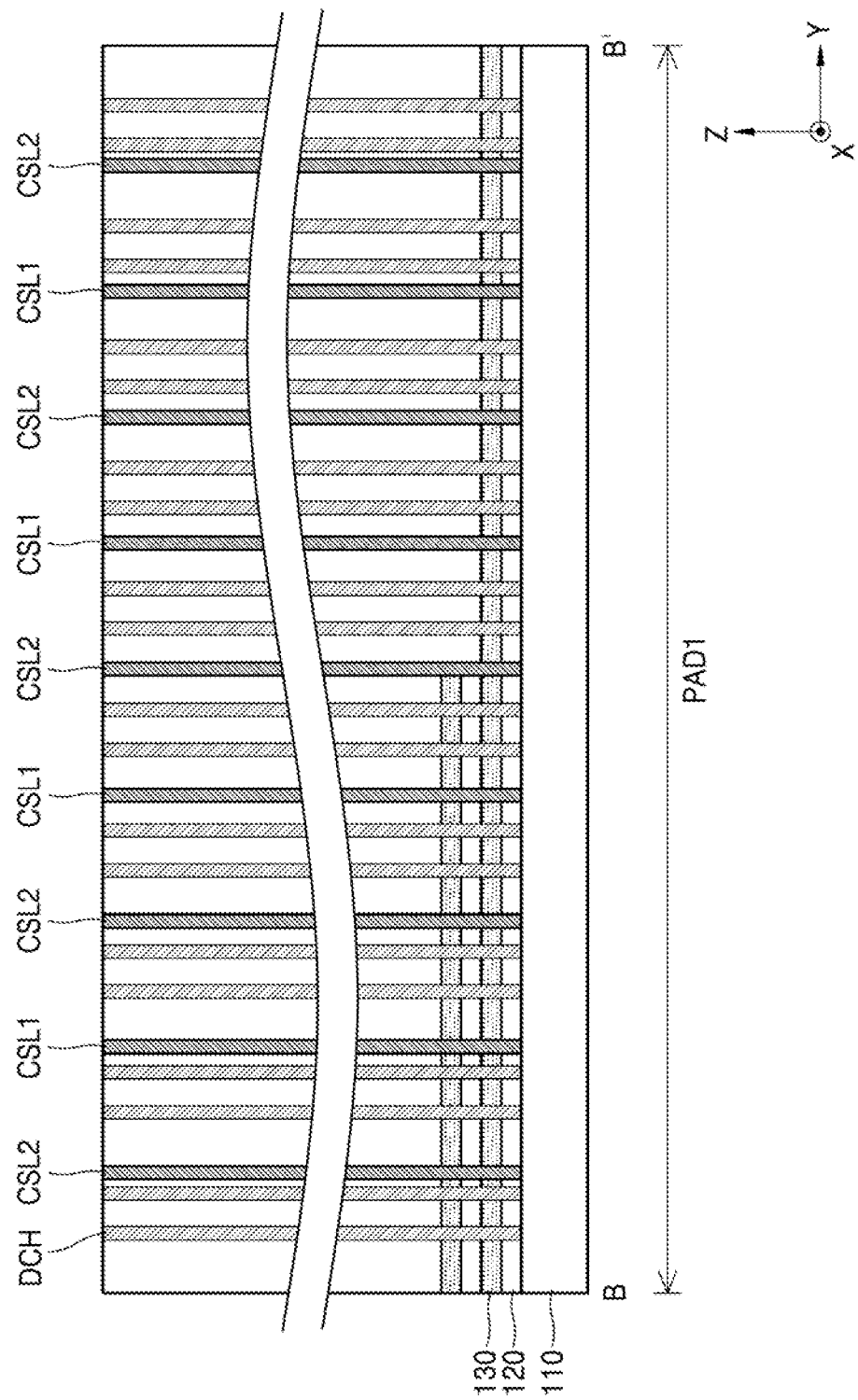
FIG. 6 is a cross-sectional view taken along line BB' of FIG. 1.
Figure 7:
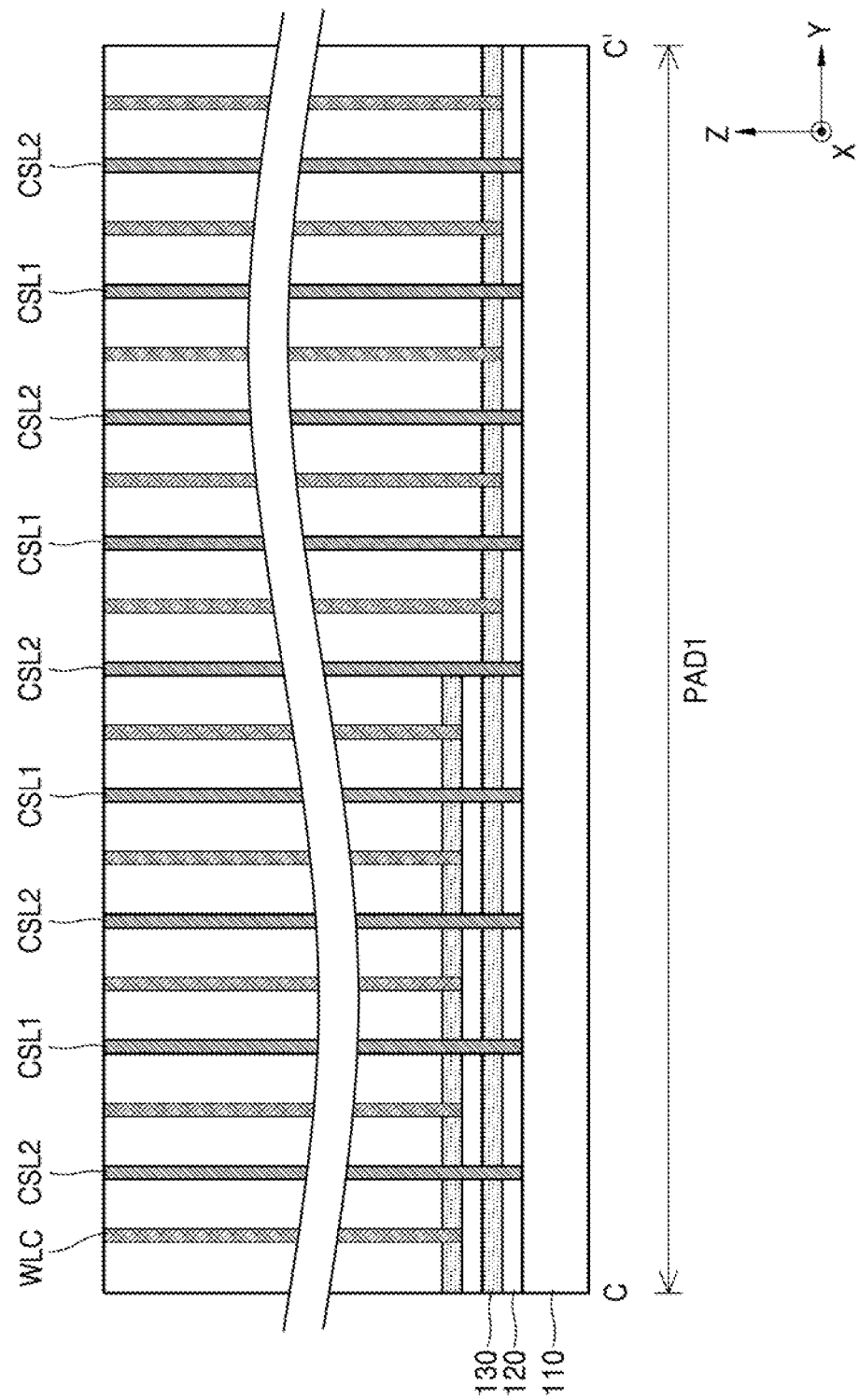
FIG. 7 is a cross-sectional view taken along line CC' of FIG. 1.

FIG. 5 is a cross-sectional view taken along line AA' of FIG. 1, FIG. 6 is a cross-sectional view taken along line BB' of FIG. 1, and FIG. 7 is a cross-sectional view taken along line CC' of FIG. 1.

Referring to FIGS. 5 to 7, a three-dimensional semiconductor device according to an exemplary embodiment of the present inventive concept may include a substrate 110, a stacked structure SS, a channel structure CH, a dummy channel structure DCH, a first common source line CSL1, a second common source line CSL2, a third common source line CSL3 (see FIG. 1), and a word line contact WLC.

The substrate 110 may include a semiconductor material such as a Group IV semiconductor material, a Group III-V semiconductor material, or a Group II-VI semiconductor material. The Group IV semiconductor material may include, for example, silicon (Si), germanium (Ge), or a combination thereof. The Group III-V semiconductor material may include, for example, gallium arsenide (GaAs), indium phosphide (InP), gallium phosphide (GaP), indium arsenide (InAs), indium antimonide (InSb), indium gallium arsenide (InGaAs), or a combination thereof. The Group II-VI semiconductor material may include, for example, zinc telluride (ZnTe), cadmium sulphide (CdS), or a combination thereof. The substrate 110 may be a bulk wafer or an epitaxial layer.

The stacked structure SS may be located on the substrate 110. The first pad region PAD1 and the second pad region PAD2 (see FIG. 1) of the stacked structure SS may be stepped. For example, the steps in the first pad region PAD1 and the second pad region PAD2 (see FIG. 1) of the stacked structure SS may have areas decreasing by a given rate from a lowermost level toward an uppermost level thereof. The stacked structure SS may include a plurality of insulating layers 120 and a plurality of conductive layers 130. The plurality of insulating layers 120 may include, for example, silicon oxide ($SiO_2$). The plurality of conductive layers 130 may include, for example, copper (Cu), aluminum (Al), silver (Ag), gold (Au), tungsten (W), or a combination thereof. The plurality of insulating layers 120 and the plurality of conductive layers 130 may be alternately stacked upon each other. Each of the plurality of conductive layers 130 may function as one of a ground selection line, a word line, and a string selection line of a non-volatile memory semiconductor device. For example, a conductive layer 130 closest to the substrate 110 may be a ground selection line, a conductive layer 130 farthest from the substrate 110 may be a string selection line, and the remaining conductive layers 130 may be word lines. However, the present inventive concept is not limited thereto. For example, two conductive layers 130 may function as the string selection lines, and may be formed at an uppermost level and one level directly under the uppermost level.

The channel structure CH may contact the main surface of the substrate 110 through the cell region CELL. A detailed structure of the channel structure CH is described in more detail below with reference to FIGS. 8 and 9. Due to an internal stress, the channel structure CH may be tilted toward the center plane CP with respect to the third direction Z in the cell region CELL. An angle formed by the channel structure CH with the third direction Z may be greater than an angle formed by the dummy channel structure DCH with the third direction Z. The internal stress may be canceled out in the first pad region PAD1 and the second pad region PAD2 (see FIG. 1). For example, the dummy channel structure DCH may be parallel to the third direction Z. The dummy channel structure DCH may contact the main surface of the substrate 110 through the first pad region PAD1 or the second pad region PAD2 (see FIG. 1). A detailed structure of the dummy channel structure DCH may be similar to that of the channel structure CH to be described with reference to FIGS. 8 and 9.

The first common source line CSL1 may contact the main surface of the substrate 110 through the cell region CELL, the first pad region PAD1, and the second pad region PAD2 (see FIG. 2). The second common source line CSL2 may contact the main surface of the substrate 110 through the first pad region PAD1. The third common source line CSL3 (see FIG. 1) may contact the main surface of the substrate 110 through the second pad region PAD2.

Insulating layers may be located between the first common source line CSL1 and the stacked structure SS, between the second common source line CSL2 and the stacked structure SS, and between the third common source line CSL3 and the stacked structure SS.

The first common source line CSL1, the second common source line CSL2, and the third common source line CSL3 may include, for example, Cu, Al, Ag, Au, W, or a combination thereof.

Due to an internal stress, the first common source line CSL1 may be tilted toward the center plane CP with respect to the third direction Z in the cell region CELL. As shown in FIG. 5, the first common source line CSL1 between the channel structures CH may be tilted toward the center plane CP with respect to the third direction Z. An angle formed by the first common source line CSL1 with the third direction Z in the cell region CELL may be greater than an angle formed by the first common source line CSL1 with the third direction Z in the first pad region PAD1 and the second pad region PAD2. In an exemplary embodiment of the present inventive concept, an angle formed by the first common source line CSL1 with the third direction Z in the first pad region PAD1 and the second pad region PAD2 (see FIG. 1) may increase as the position of the first common source line CSL1 gets closer to the cell region CELL. The internal stress may be canceled out in the first pad region PAD1 and the second pad region PAD2 (see FIG. 1). In an exemplary embodiment of the present inventive concept, the first common source line CSL1 may be parallel to the third direction Z in the first pad region PAD1 and the second pad region PAD2 (see FIG. 1). As shown in FIG. 6, the first common source line CSL1 between the dummy channel structures DCH may be parallel to the third direction Z. In addition, the second common source line CSL2 may be parallel to the third direction Z in the first pad region PAD1. In addition, the third common source line CSL3 (see FIG. 1) may be parallel to the third direction Z in the second pad region PAD2 (see FIG. 1).

Referring to FIGS. 1 and 7, the plurality of word line contacts WLC may be placed on the first pad region PAD1 or the second pad region PAD2. Since the first common source line CSL1 is parallel to the third direction Z in the first pad region PAD1 and the second pad region PAD2, the second common source line CSL2 is parallel to the third direction Z in the first pad region PAD1, the third common source line CSL3 is parallel to the third direction Z in the second pad region PAD2, and the word line contact WLC is parallel to the third direction Z in the first pad region PAD1 and the second pad region PAD2, the plurality of word line contacts WLC may not contact the first common source line CSL1, the second common source line CSL2, or the third common source line CSL3.

According to an exemplary embodiment of the present inventive concept, the asymmetrical arrangement of the first to third common source lines CSL1, CSL2, and CSL3 in the first pad region PAD1 and the second pad region PAD2 results in an internal stress that causes the dummy channel structure DCH and the first to third common source lines CSL1, CSL2, and CSL3 to tilt away from the center plane CP with respect to the third direction Z. The internal stress due to the asymmetrical arrangement of the first to third common source lines CSL1, CSL2, and CSL3 may offset an internal stress that causes the first to third common source lines CSL1, CSL2, and CSL3 to tilt toward the center plane CP with respect to the third direction Z. Thus, the first to third common source lines CSL1, CSL2, and CSL3 and the dummy channel structure DCH may be prevented from tilting toward the center plane CP with respect to the third direction Z in the first pad region PAD1 and the second pad region PAD2. Thus, formation of bridges between the first to third common source lines CSL1, CSL2, and CSL3 and the plurality of word line contacts WLC may be prevented. For example, when the first to third common source lines CSL1, CSL2, and CSL3 are tilted, bridges may be formed between the first to third common source lines CSL1, CSL2, and CSL3 and the plurality of word line contacts WLC. For example, an upper portion of one of the tilted first to third common source lines CSL1, CSL2, and CSL3 may contact an adjacent word line contact WLC to form a bridge.

Figure 8:
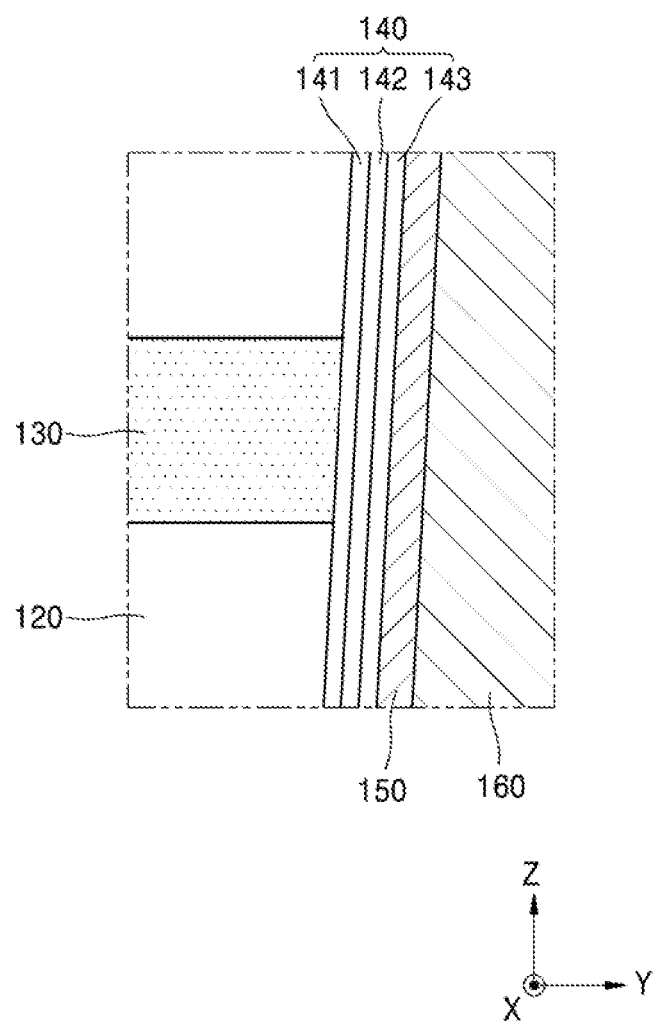
FIG. 8 is an enlarged view of region R in FIG. 5, according to an exemplary embodiment of the present inventive concept.

FIG. 8 is an enlarged view of region R in FIG. 5, according to an exemplary embodiment of the present inventive concept.

Referring to FIG. 8, the channel structure CH (see FIG. 5) may include a channel layer 150, a buried insulating layer 160, and an information storage layer 140. The channel layer 150 may include a semiconductor material such as, for example, silicon (Si), germanium (Ge), or a combination thereof. The buried insulating layer 160 may be filled in a space surrounded by the channel layer 150. The buried insulating layer 160 may include an insulating material such as silicon oxide ($SiO_2$).

The information storage layer 140 may be located between the channel layer 150 and a conductive layer 130. The information storage layer 140 may extend between the insulating layer 120 and the channel layer 150 as well as between the conductive layer 130 and the channel layer 150. The information storage layer 140 may include a blocking insulating layer 141, a charge storage layer 142, and a tunnel insulating layer 143. The blocking insulating layer 141 may be in contact with the conductive layer 130. The tunnel insulating layer 143 may be in contact with the channel layer 150. The charge storage layer 142 may be located between the blocking insulating layer 141 and the tunnel insulating layer 143. The blocking insulating layer 141 may include a high dielectric constant material such as, for example, aluminum oxide ($Al_2O_3$) or hafnium oxide ($HfO_2$). The charge storage layer 142 may be of a trap type. For example, the charge storage layer 142 may include quantum dots or nanocrystals. The quantum dots or nanocrystals may include fine particles of a conductive material. The charge storage layer 142 may include, for example, silicon nitride ($Si_3N_4$). The tunnel insulating layer 143 may include, for example, silicon oxide ($SiO_2$).

Figure 9:
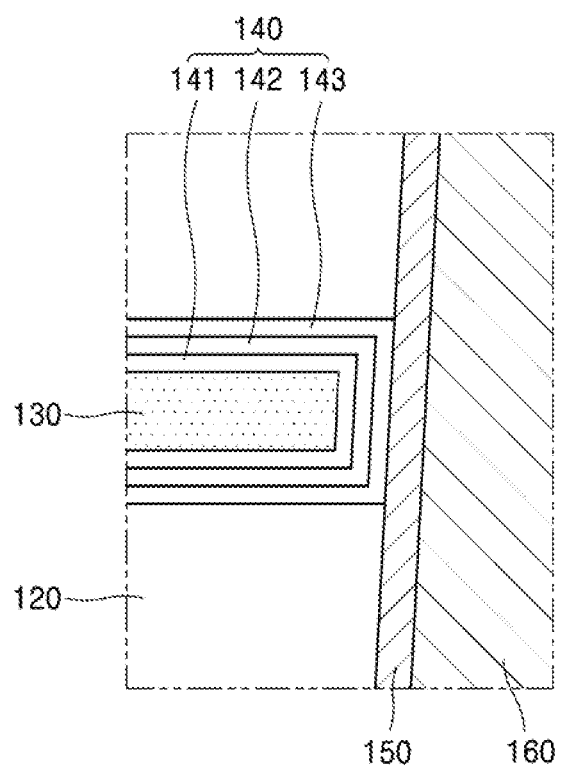
FIG. 9 is an enlarged view of region R in FIG. 5, according to an exemplary embodiment of the present inventive concept.

FIG. 9 is an enlarged view of region R in FIG. 5, according to an exemplary embodiment of the present inventive concept.

As shown in FIG. 9, the arrangement and shape of the information storage layer 140 may be modified. In an exemplary embodiment of the present inventive concept, the information storage layer 140 may extend between the insulating layer 120 and the conductive layer 130 without extending between the channel layer 150 and the insulating layer 120. In an exemplary embodiment of the present inventive concept, as shown in FIG. 9, some of the blocking insulating layer 141, the charge storage layer 142, and the tunnel insulating layer 143, which constitute the information storage layer 140, may extend between the channel layer 150 and the conductive layer 130, and the remainder may extend between the insulating layer 120 and the conductive layer 130.

Figure 10A:
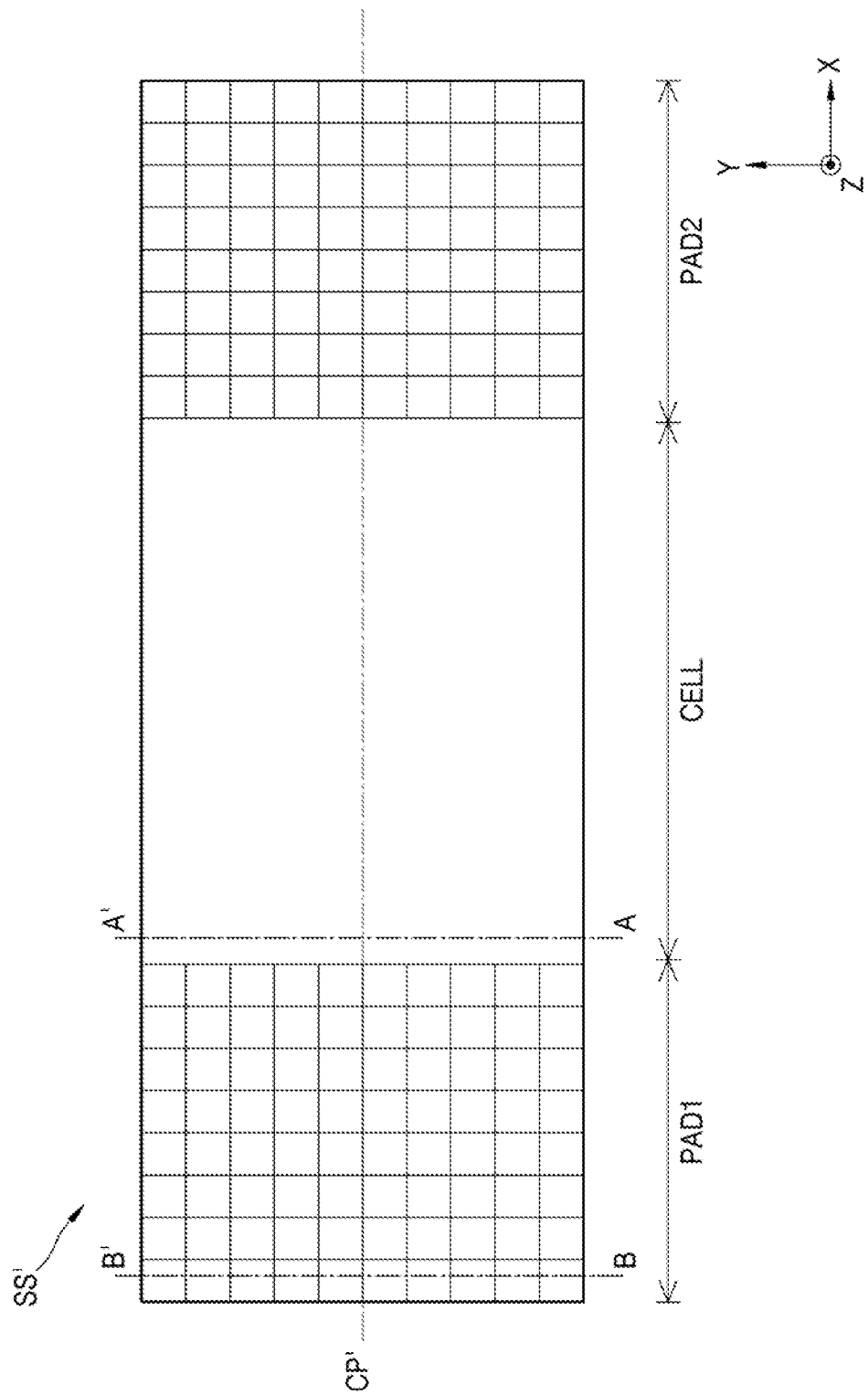
FIG. 10A is a plan view illustrating a method of manufacturing a semiconductor device, according to an exemplary embodiment of the present inventive concept.

FIG. 10A is a plan view illustrating a method of manufacturing a semiconductor device, according to an exemplary embodiment of the present inventive concept, and FIGS. 10B to 14B are cross-sectional views illustrating a method of manufacturing a semiconductor device, according to an exemplary embodiment of the present inventive concept. FIGS. 15A to 15C are plan views illustrating the arrangement of word line cuts.

Figure 10B:
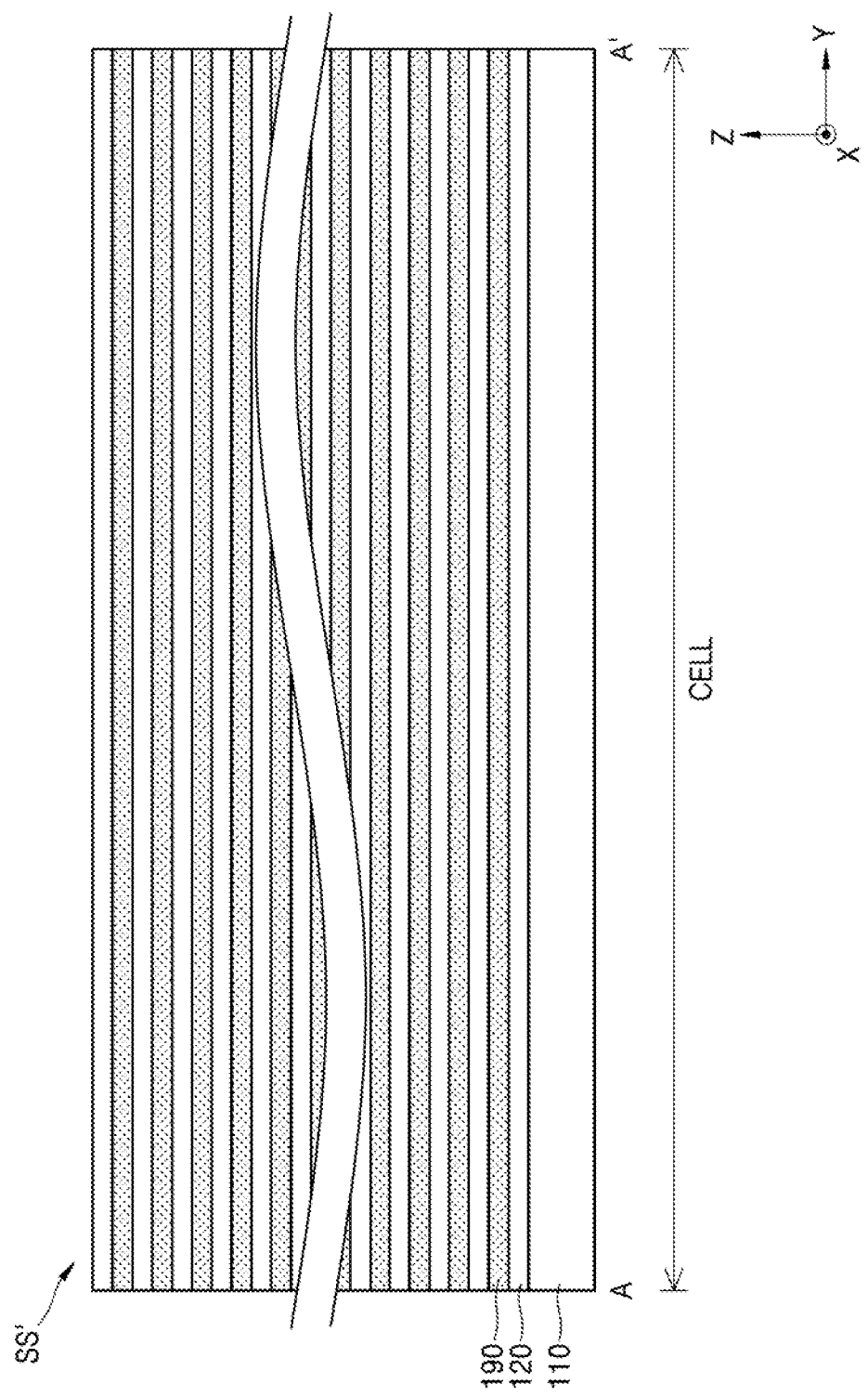

Referring to FIGS. 10A to 10C, a pre-stacked structure SS' may be formed on a substrate 110. The pre-stacked structure SS' may include a plurality of insulating layers 120 and a plurality of sacrificial layers 190 alternately stacked upon each other. The plurality of sacrificial layers 190 may include, for example, silicon nitride ($Si_3N_4$). The pre-stacked structure SS' may include a cell region CELL, a first pad region PAD1, and a second pad region PAD2. The first pad region PAD1 and the second pad region PAD2 may be patterned in a stepped shape. For example, steps of the patterned step shape in the first pad region PAD1 and the second pad region PAD2 of the pre-stacked structure SS' may have areas decreasing by a given rate from a lowermost level toward an uppermost level thereof.

Figure 11A:
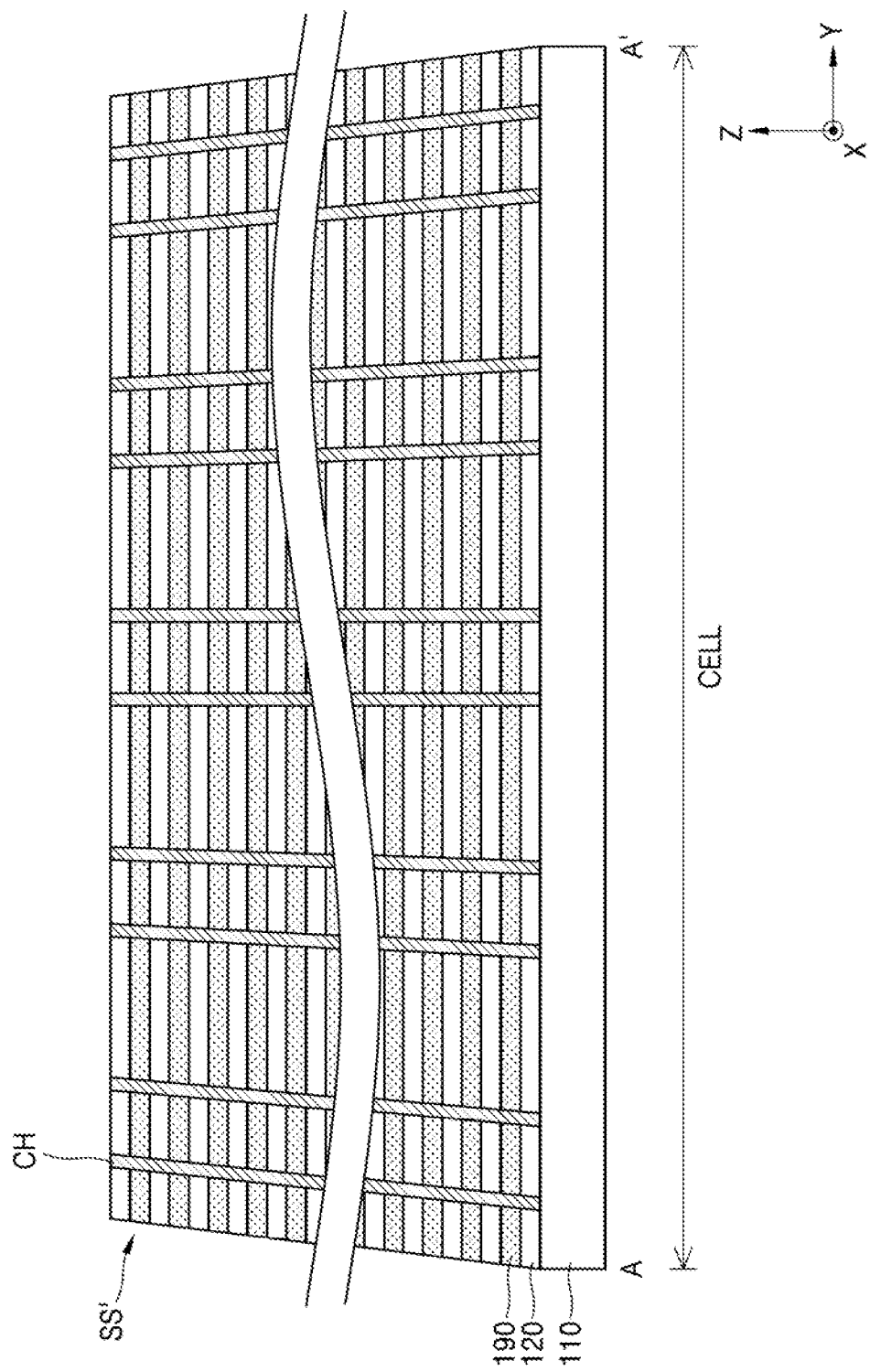
Figure 11B:
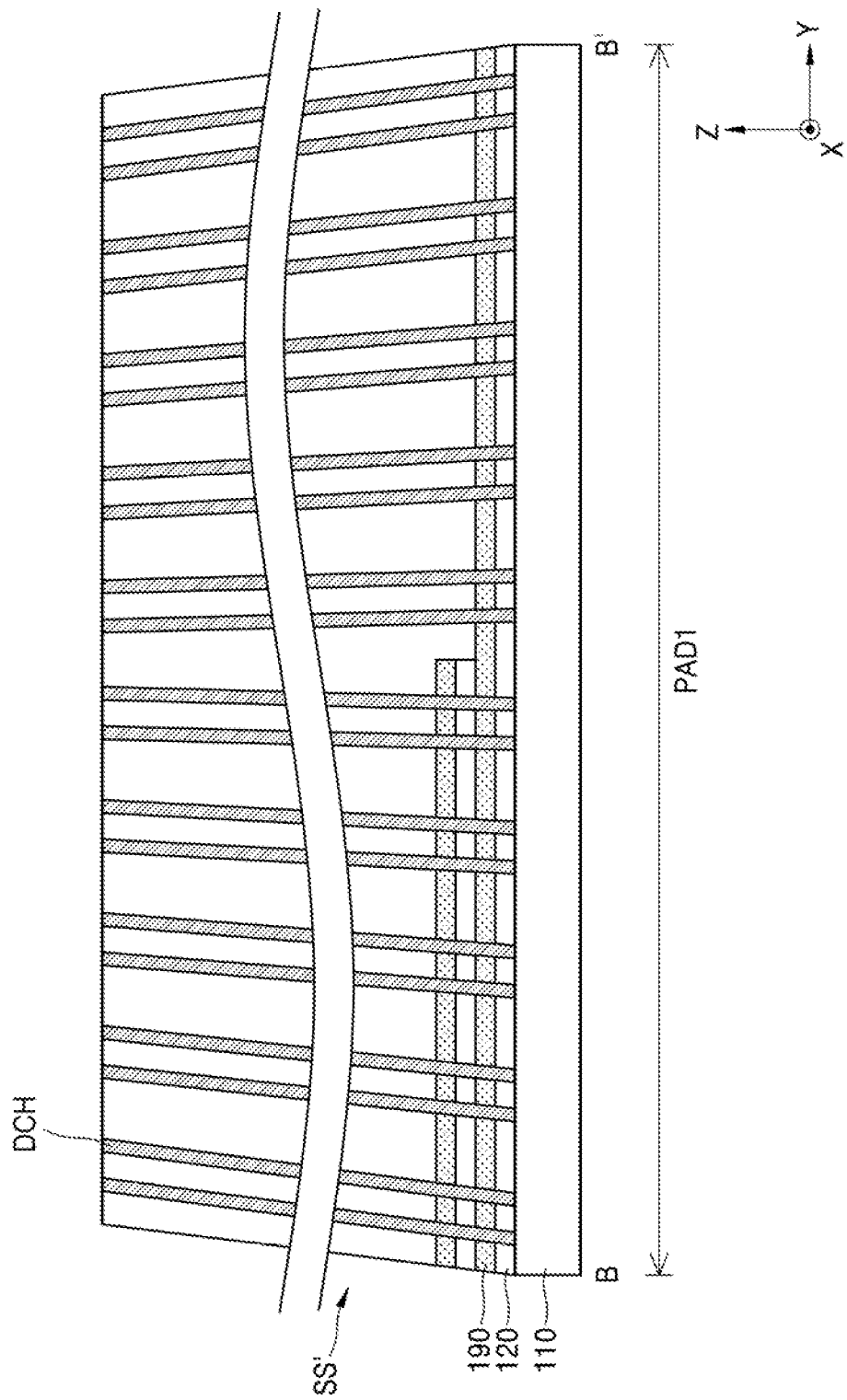

Referring to FIGS. 11A and 11B, a channel structure CH passing through the cell region CELL of the pre-stacked structure SS' may be formed. At the same time, a dummy channel structure DCH passing through the first pad region PAD1 or the second pad region PAD2 (see FIG. 10A) of the pre-stacked structure SS' may be formed. After the channel structure CH and the dummy channel structure DCH are formed, the channel structure CH and the dummy channel structure DCH may be tilted with respect to the third direction Z due to an internal stress.

Figure 12B:
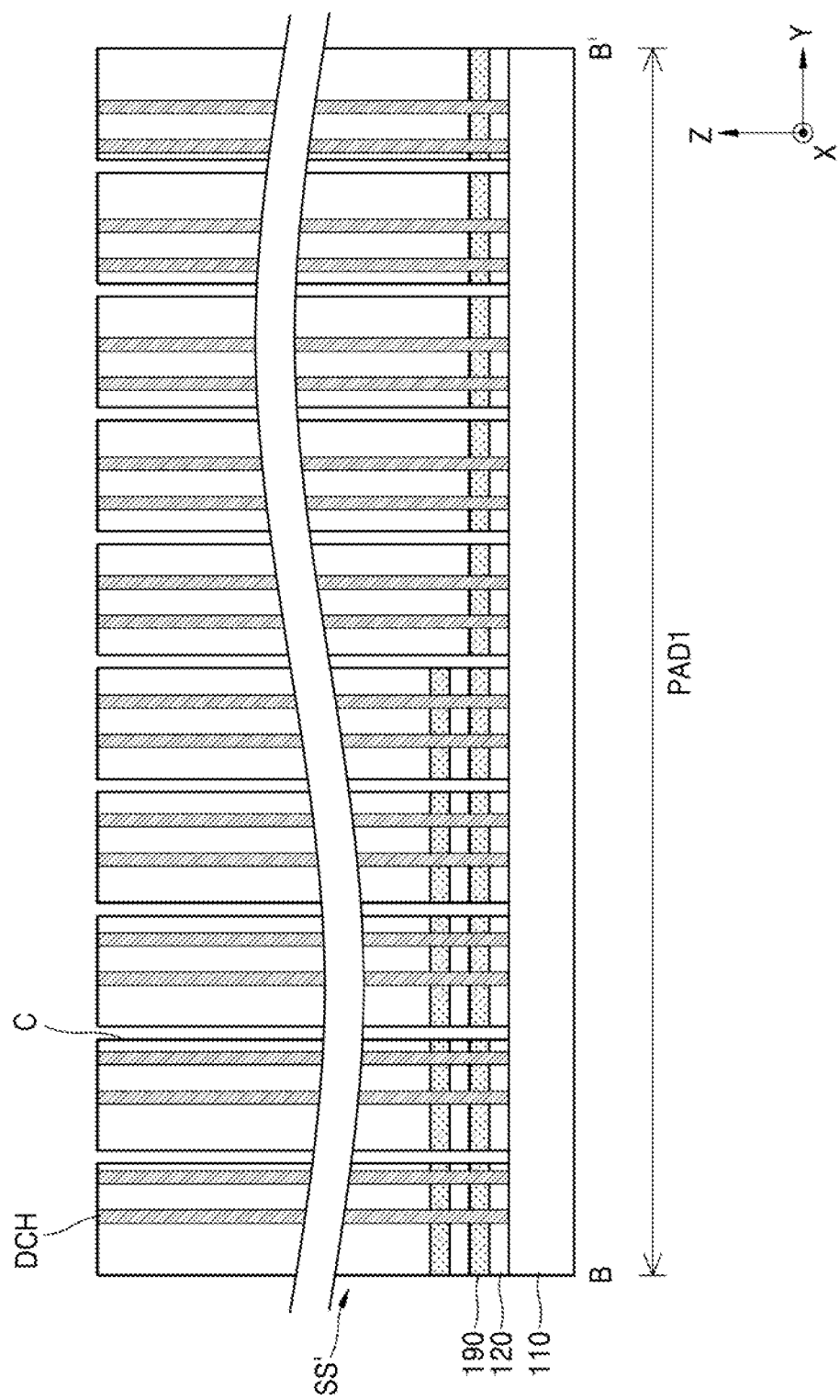

Referring to FIGS. 12A and 12B, a plurality of word line cuts C may be formed. One portion of the plurality of word line cuts C may cross the first pad region PAD1, the cell region CELL and the second pad region PAD2 (see FIG. 10A), another potion may only cross the first pad region PAD1, and another portion may only cross the second pad region PAD2 (see FIG. 10A). The plurality of word line cuts C may be parallel to the third direction Z. After the plurality of word line cuts C are formed, the channel structure CH and the dummy channel structure DCH may be parallel to the third direction Z.

Referring to FIG. 15A, a first word line cut C1 may cross the first pad region PAD1, the cell region CELL, and the second pad region PAD2 (see FIG. 10A). The first word line cut C1 may pass between a first channel structure CH1 and a second channel structure CH2 in the cell region CELL. The first word line cut C1 in the cell region CELL may be a straight line parallel to the first direction X. Also, the first word line cut C1 may pass between a first dummy channel structure DCH1 and a second dummy channel structure DCH2 and between a third dummy channel structure DCH3 and a fourth dummy channel structure DCH4 in the first pad region PAD1. The first word line cut C1 in the first pad region PAD1 or second pad region PAD2 (see FIG. 10A) may be a straight line or may be curved.

A distance d1c in the second direction Y between the first word line cut C1 and the first channel structure CH1 may be equal to a distance d2c in the second direction Y between the first word line cut C1 and the second channel structure CH2. On the other hand, a distance d3c in the second direction Y between the first word line cut C1 and the first dummy channel structure DCH1 may be different from a distance d4c in the second direction Y between the first word line cut C1 and the second dummy channel structure DCH2. In addition, a distance d5c in the second direction Y between the first word line cut C1 and the third dummy channel structure DCH3 may be different from a distance d6c in the second direction Y between the first word line cut C1 and the fourth dummy channel structure DCH4.

In an exemplary embodiment of the present inventive concept, a difference between the distance d5c in the second direction Y between the first word line cut C1 and the third dummy channel structure DCH3 and the distance d6c in the second direction Y between the first word line cut C1 and the fourth dummy channel structure DCH4 may be greater than a difference between the distance d3c in the second direction Y between the first word line cut C1 and the first dummy channel structure DCH1 and the distance d4c in the second direction Y between the first word line cut C1 and the second dummy channel structure DCH2.

The first word line cut C1 may be closer to one of the first dummy channel structure DCH1 and the second dummy channel structure DCH2, whichever is farther away from a center plane CP' of the pre-stacked structure SS' (see FIG. 10A). For example, since the first dummy channel structure DCH1 is farther away from the center plane CP' of the pre-stacked structure SS' (see FIG. 10A) than the second dummy channel structure DCH2, the first word line cut C1 may be closer to the first dummy channel structure DCH1. Similarly, the first word line cut C1 may be closer to one of the third dummy channel structure DCH3 and the fourth dummy channel structure DCH4, whichever is farther away from the center plane CP' of the pre-stacked structure SS' (see FIG. 10A). For example, since the third dummy channel structure DCH3 is farther away from the center plane CP' of the pre-stacked structure SS' (see FIG. 10A) than the fourth dummy channel structure DCH4, the first word line cut C1 may be closer to the third dummy channel structure DCH3.

The first channel structure CH1 and the second channel structure CH2 in the cell region CELL may be mirror-symmetric with respect to the first word line cut C1, but the first dummy channel structure DCH1 and the second dummy channel structure DCH2 in the first pad region PAD1 may not be mirror-symmetric with respect to the first word line cut C1. As such, in the first pad region PAD1 and the second pad region PAD2 (see FIG. 10A), the first word line cut C1 may be arranged in such a way that the dummy channel structures DCH are asymmetric with respect to the first word line cut C1.

Referring to FIG. 15B, a second word line cut C2 may cross the first pad region PAD1. The second word line cut C2 may pass between a fifth dummy channel structure DCH5 and a sixth dummy channel structure DCH6. A distance d7c in the second direction Y between the second word line cut C2 and the fifth dummy channel structure DCH5 may be different from a distance d8c in the second direction Y between the second word line cut C2 and the sixth dummy channel structure DCH6. The second word line cut C2 may be closer to one of the fifth dummy channel structure DCH5 and the sixth dummy channel structure DCH6, whichever is farther away from the center plane CP' of the pre-stacked structure SS' (see FIG. 10A). For example, since the fifth dummy channel structure DCH5 is farther away from the center plane CP' of the pre-stacked structure SS' (see FIG. 10A) than the sixth dummy channel structure DCH6, the second word line cut C2 may be closer to the fifth dummy channel structure DCH5. That is, the fifth dummy channel structure CH5 and the sixth dummy channel structure CH6 in the first pad region PAD1 may not be mirror-symmetric with respect to the second word line cut C2. As such, the second word line cut C2 in the first pad region PAD1 may be arranged in such a way that the dummy channel structures DCH are asymmetric with respect to the second word line cut C2.

Referring to FIG. 15C, a third word line cut C3 may cross the second pad region PAD2. The third word line cut C3 may pass between a seventh dummy channel structure DCH7 and an eighth dummy channel structure DCH8. A distance d9c in the second direction Y between the third word line cut C3 and the seventh dummy channel structure DCH7 may be different from a distance d10c in the second direction Y between the third word line cut C3 and the eighth dummy channel structure DCH8. The third word line cut C3 may be closer to one of the seventh dummy channel structure DCH7 and the eighth dummy channel structure DCH8, whichever is farther away from the center plane CP' of the pre-stacked structure SS' (see FIG. 10A). For example, since the seventh dummy channel structure DCH7 is farther away from the center plane CP' of the pre-stacked structure SS' (see FIG. 10A) than the eighth dummy channel structure DCH8, the second word line cut C2 may be closer to the seventh dummy channel structure DCH7. That is, the seventh dummy channel structure DCH7 and the eighth dummy channel structure DCH8 in the second pad region PAD2 may not be mirror-symmetric with respect to the third word line cut C3. As such, the third word line cut C3 in the second pad region PAD2 may be arranged in such a way that the dummy channel structures DCH are asymmetric with respect to the third word line cut C3.

Figure 13A:
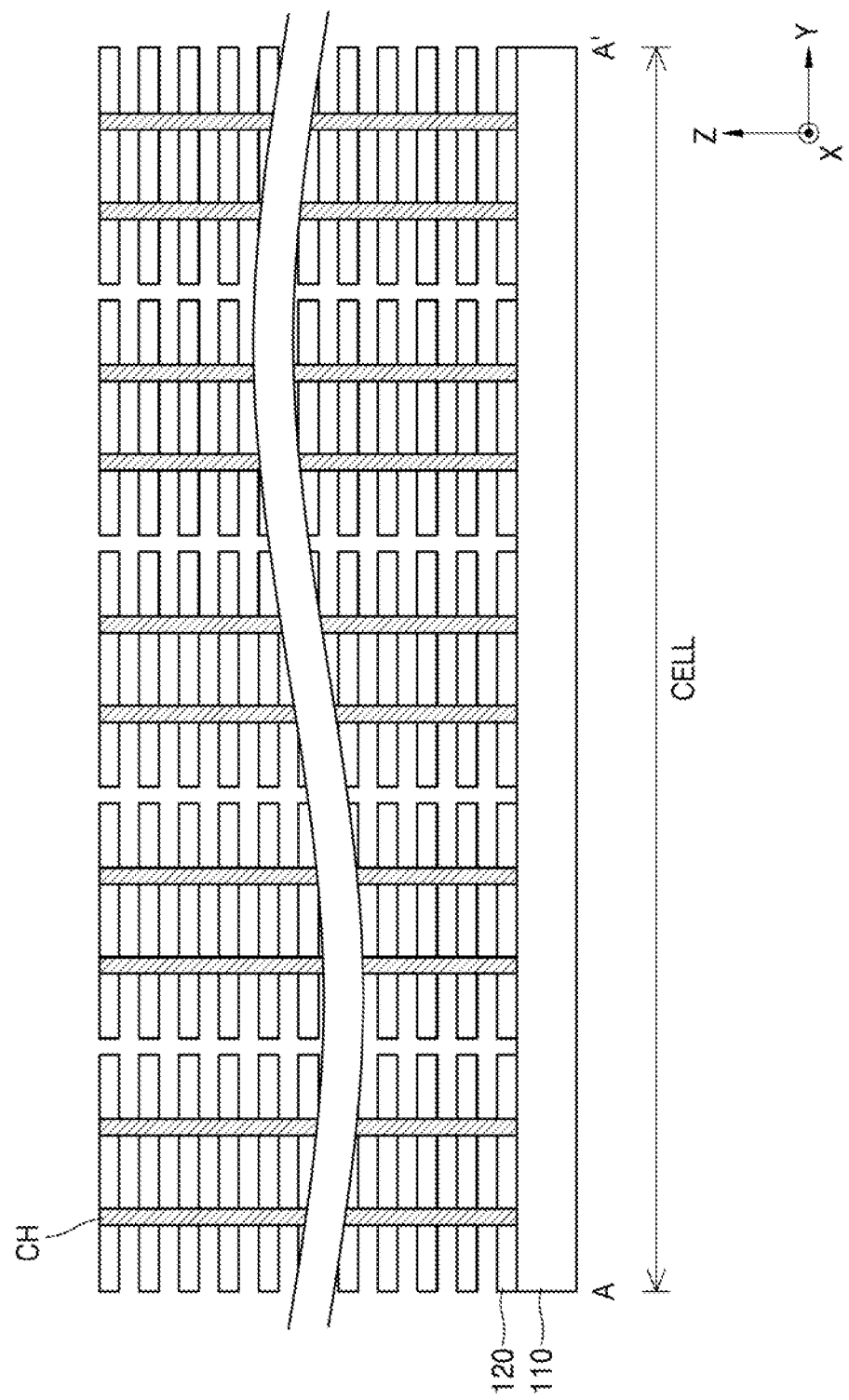
Figure 13B:
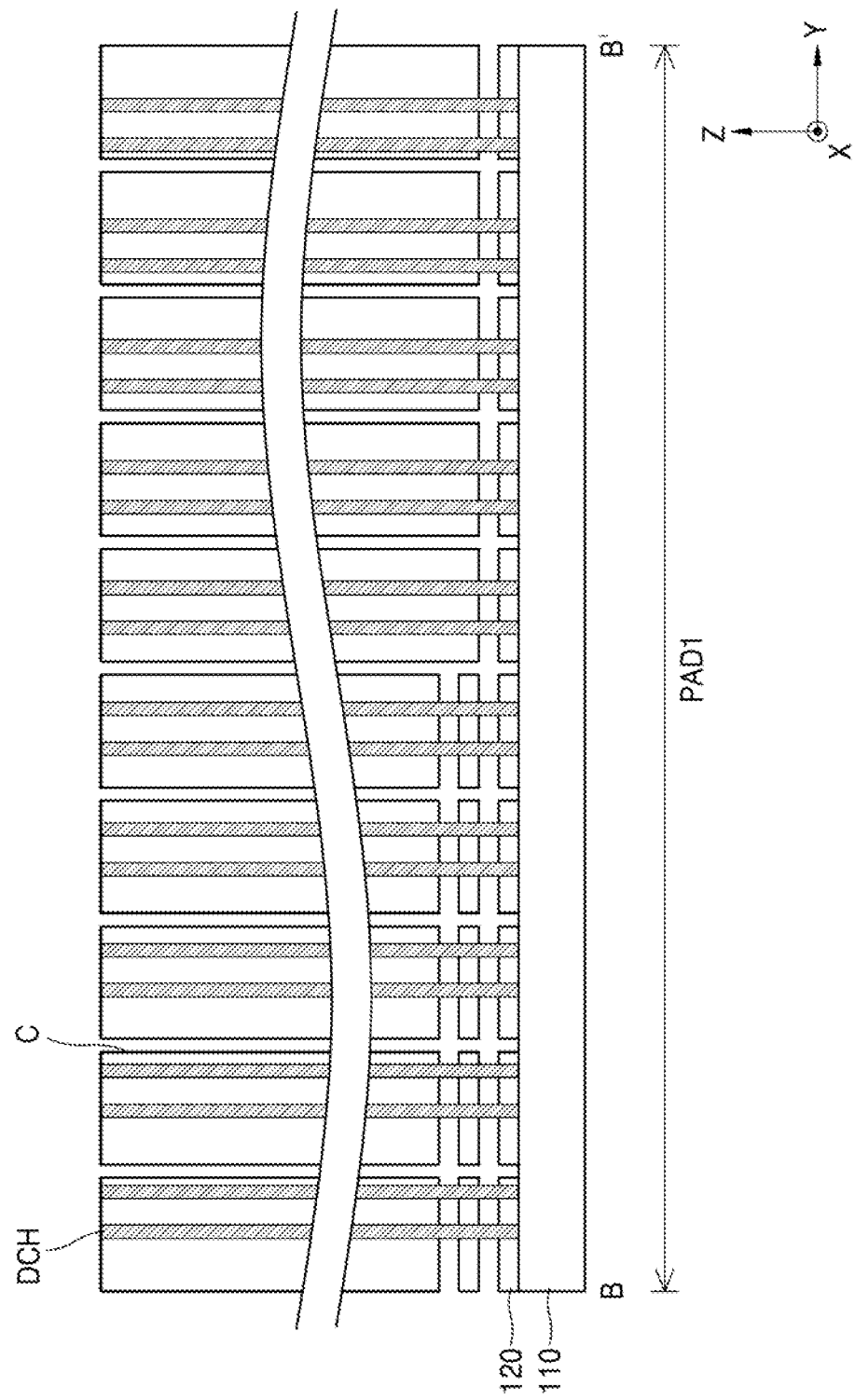

Referring to FIGS. 13A and 13B, the sacrificial layers 190 (see FIGS. 12A and 12B) may be removed.

Figure 14A:
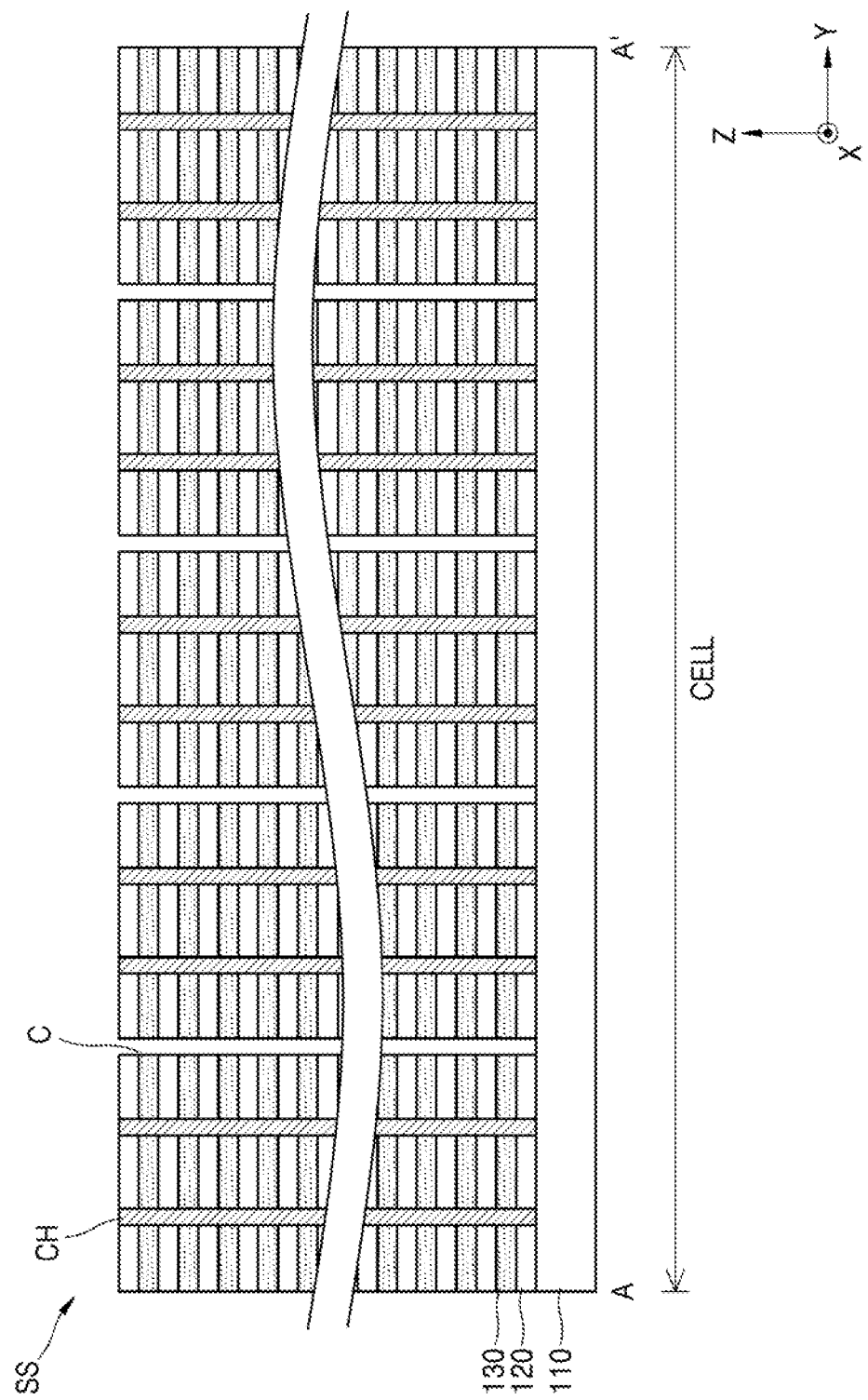
Figure 14B:
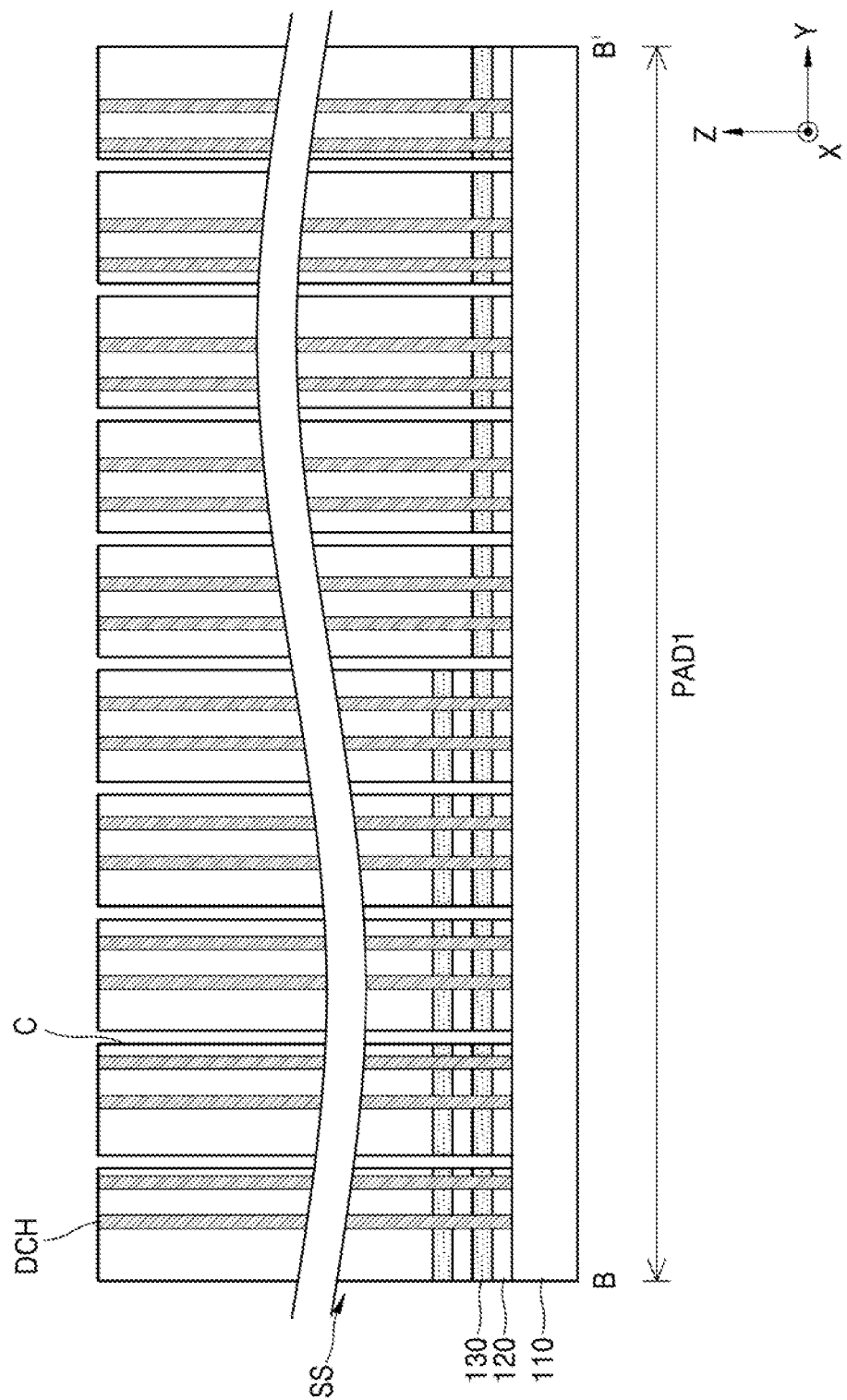
Figure 15A:
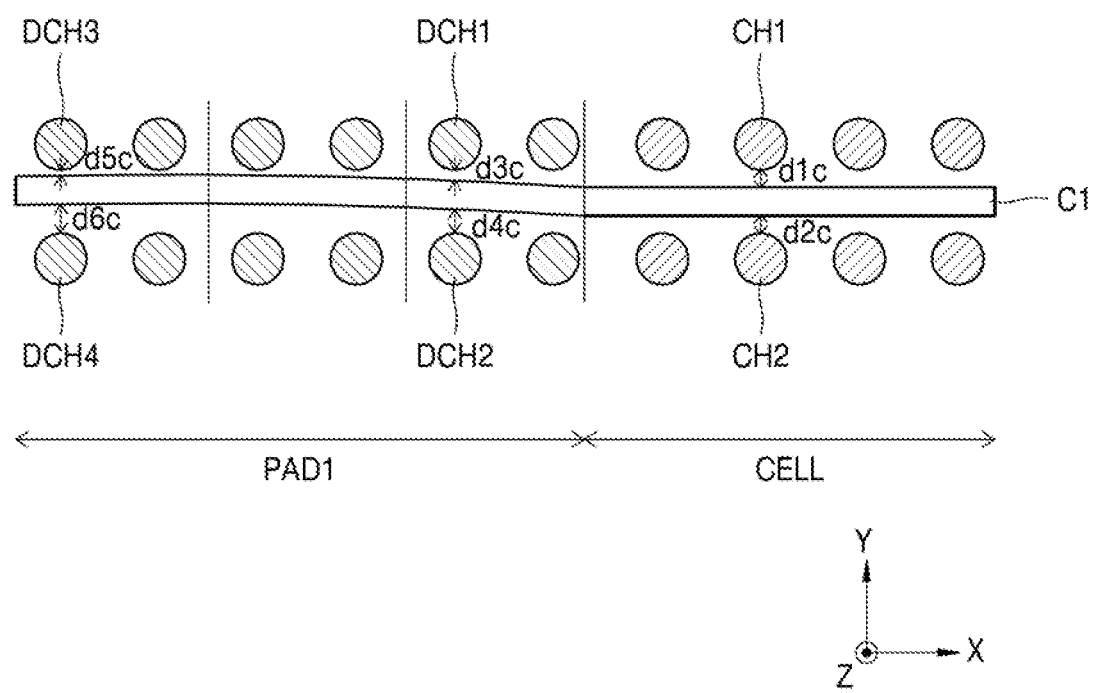
FIGS. 15A to 15C are plan views illustrating the arrangement of word line cuts.
Figure 15B:
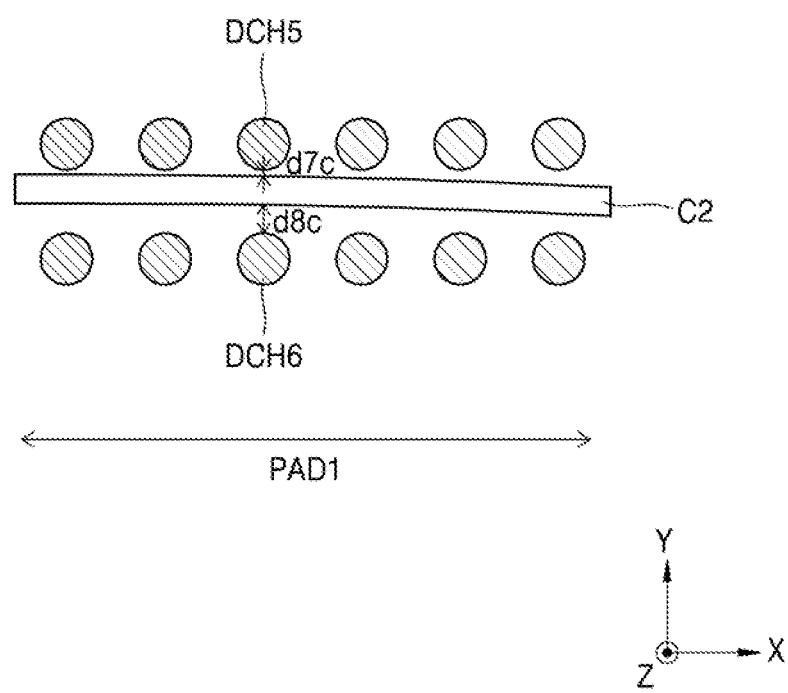
Figure 15C:
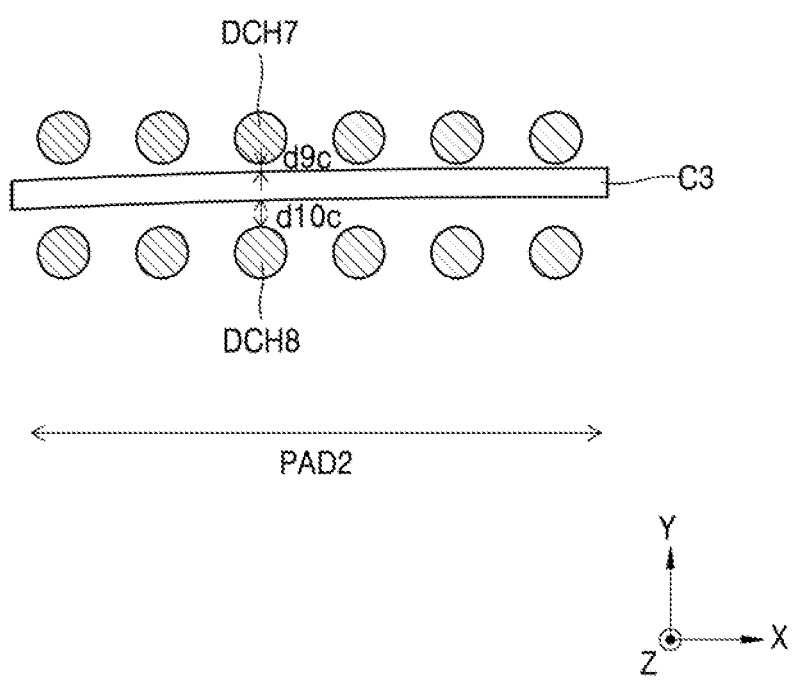

Referring to FIGS. 14A and 14B, conductive layers 130 may be formed in spaces from which the sacrificial layers 190 are removed. Thus, a stacked structure SS may be formed.

Referring to FIGS. 1, 5, and 6, the first common source line CSL1 to the third common source line CSL3 may be formed in the plurality of word line cuts C. After the first common source line CSL1 to the third common source line CSL3 are formed, the first common source line CSL1 may be tilted toward the center plane CP (see FIG. 1) with respect to the third direction Z in the cell region CELL, due to an internal stress. In addition, the channel structure CH in the cell region CELL may be tilted toward the center plane CP (see FIG. 1) with respect to the third direction Z. On the other hand, the internal stress may be offset due to the asymmetrical arrangement of the first common source line CSL1 in the first pad region PAD1 and the second pad region PAD2, the asymmetrical arrangement of the second common source line CSL2 in the first pad region PAD11, and the asymmetrical arrangement of the third common source line CSL3 in the second pad region PAD2. Thus, the first common source line CSL1 in the first pad region PAD1 and the second pad region PAD2 may be parallel to the third direction Z. The second common source line CSL2 in the first pad region PAD1 may be parallel to the third direction Z. The third common source line CSL3 in the second pad region PAD2 may be parallel to the third direction Z. In addition, the dummy channel structure DCH may be parallel to the third direction Z.

Next, a plurality of word line contacts WLC may be formed on the first pad region PAD1 and the second pad region PAD2. Since the first common source line CSL1 to the third common source line CSL3 are parallel to the third direction Z in the first pad region PAD1 and the second pad region PAD2, formation of bridges between the plurality of word line contacts WLC and the first to third common source lines CSL1 to CSL3 may be prevented. For example, when the first to third common source lines CSL1 to CSL3 are tilted, bridges may be formed between the first to third common source lines CSL1 to CSL3 and the plurality of word line contacts WLC. For example, an upper portion of one of the tilted first to third common source lines CSL1 to CSL3 may contact an adjacent word line contact WLC to form a bridge. On the other hand, when the word line contacts WLC and the first to third common source lines CSL1 to CSL3 are parallel to the third direction Z, the upper portions of the first to third common source lines CSL1 to CSL3 may not contact the adjacent word line contacts WLC to form bridges. Thus, the asymmetrical arrangement of the first to third common source lines CSL1 to CSL3 in the first pad region PAD1 and the second pad region PAD2 according to an exemplary embodiment of the present inventive concept may prevent bridge formation between the plurality of word line contacts WLC and the first to third common source lines CSL1 to CSL3, and thus may enhance the reliability of the three-dimensional semiconductor memory device.

Figure 16:
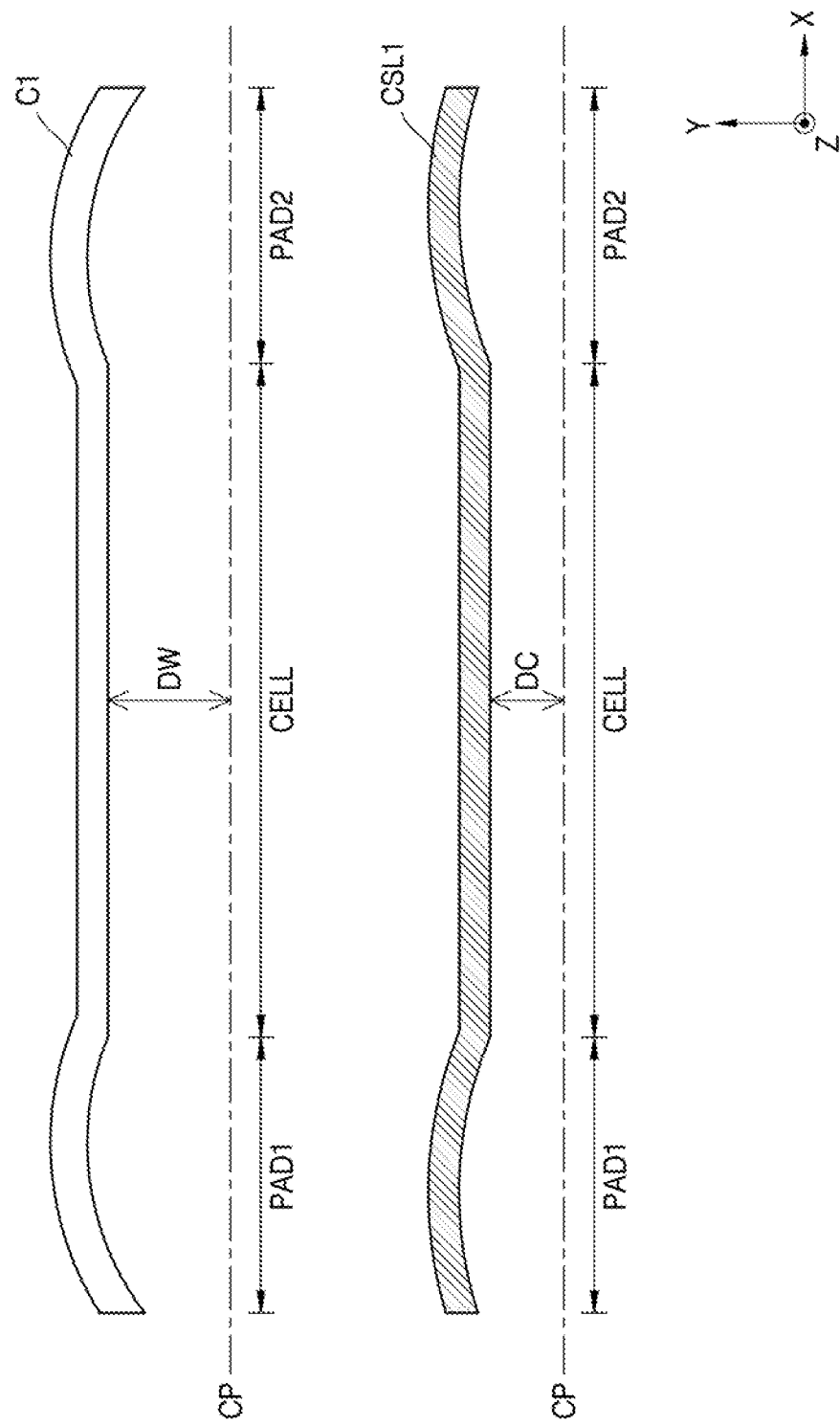
FIG. 16 illustrates an example in which the shape of a first word line cut before a first common source line is formed is compared to the shape of the first common source line after the first common source line filling the first word line cut is formed.

FIG. 16 illustrates an example in which the shape of the first word line cut C1 before the first common source line CSL1 is formed is compared to the shape of the first common source line CSL1 after the first common source line CSL1 filling the first word line cut C1 is formed.

Referring to FIG. 16, a portion of the first common source line CSL1 crossing the cell region CELL after the first common source line CSL1 is formed is tilted toward the center plane CP with respect to the third direction Z due to an internal stress, and thus, a difference may occur between the shape of the first word line cut C1 before the formation of the first common source line CSL1 and the shape of the first common source line CSL1 after the formation of the first common source line CSL1.

A distance DC in the second direction Y between a portion of the first common source line CSL1, which crosses the cell region CELL, and the center plane CP after the first common source line CSL1 is formed may be smaller than a distance DW in the second direction Y between a portion of the first word line cut C1, which crosses the cell region CELL, and the center plane CP before the first common source line CSL1 is formed.

Comparing FIG. 4A with FIG. 15A, although the shapes of the first common source line CSL1 and the first word line cut C1 are shown as being the same in the drawings, the shape of the first common source line CSL1 may be different from the shape of the first word line cut C1. This is due to the deformation of the first and second channel structures CH1 and CH2 and the portion of the first common source line CSL1, which crosses the cell region CELL, and the deformation is caused by an internal stress occurring after the formation of the first to third common source lines CSL1, CSL2, and CSL3. Thus, in an exemplary embodiment of the present inventive concept, the distance d1 between the first common source line CSL1 and the first channel structure CH1 and the distance d2 between the first common source line CSL1 and the second channel structure CH2 (see FIG. 4A) may be different from the distance d1c between the first word line cut C1 and the first channel structure CH1 and the distance d2c between the first word line cut C1 and the second channel structure CH2 (see FIG. 15A), respectively.

While the present inventive concept has been particularly shown and described with reference to the specific exemplary embodiments thereof, it will be understood that various changes in form and details may be made therein without departing from the spirit and scope of the present inventive concept as defined by the appended claims.

What is claimed is:

1. A three-dimensional semiconductor device comprising:
    a substrate;
    a stacked structure disposed on the substrate, the stacked structure including a cell region and a pad region;
    a first channel structure passing through the cell region;
    a second channel structure passing through the cell region and spaced apart from the first channel structure in a first direction;
    a first dummy channel structure passing through the pad region;
    a second dummy channel structure passing through the pad region, and next to and spaced apart from the first dummy channel structure in the first direction; and
    a common source line passing between the first channel structure and the second channel structure and between the first dummy channel structure and the second dummy channel structure,
    wherein the common source line includes a first side surface and a second side surface opposite to the first side surface, with the first dummy channel structure located next to the first side surface and being closer to the first side surface than to the second side surface,
    a distance in the first direction between the first side surface of the common source line and the first channel structure is equal to a distance in the first direction between the second side surface of the common source line and the second channel structure, and
    a distance in the first direction between the first side surface of the common source line and the first dummy channel structure is different from a distance in the first direction between the second side surface of the common source line and the second dummy channel structure.

2. The three-dimensional semiconductor device of claim 1, wherein the common source line is closer to one of the first dummy channel structure and the second dummy channel structure, whichever is farther away from a center plane extending in a second direction perpendicular to the first direction and being parallel to a third direction perpendicular to a main surface of the substrate and bisecting the stacked structure.

3. The three-dimensional semiconductor device of claim 1, wherein the first channel structure and the second channel structure are tilted toward a center plane with respect to a third direction perpendicular to a main surface of the substrate, with the center plane extending in a second direction perpendicular to the first direction and being parallel to the third direction and bisecting the stacked structure.

4. The three-dimensional semiconductor device of claim 3, wherein an angle formed by the first channel structure and the second channel structure with the third direction is greater than an angle formed by the first dummy channel structure and the second dummy channel structure with the third direction.

5. The three-dimensional semiconductor device of claim 3, wherein the first dummy channel structure and the second dummy channel structure are parallel to the third direction.

6. The three-dimensional semiconductor device of claim 1, wherein the common source line between the first channel structure and the second channel structure is tilted toward a center plane with respect to a third direction perpendicular to a main surface of the substrate, with the center plane extending in a second direction perpendicular to the first direction and being parallel to the third direction and bisecting the stacked structure.

7. The three-dimensional semiconductor device of claim 6, wherein an angle formed by the common source line between the first channel structure and the second channel structure with the third direction is greater than an angle formed by the common source line between the first dummy channel structure and the second dummy channel structure with the third direction.

8. The three-dimensional semiconductor device of claim 7, wherein the common source line between the first dummy channel structure and the second dummy channel structure is parallel to the third direction.

9. The three-dimensional semiconductor device of claim 1, wherein the common source line crosses the pad region and the cell region.

10. The three-dimensional semiconductor device of claim 1, further comprising:
    a third dummy channel structure disposed farther away from the cell region than the first dummy channel structure and the second dummy channel structure; and
    a fourth dummy channel structure spaced apart from the third dummy channel structure in the first direction,
    wherein the common source line passes between the third dummy channel structure and the fourth dummy channel structure, and
    a difference between a distance in the first direction between the common source line and the third dummy channel structure and a distance in the first direction between the common source line and the fourth dummy channel structure is greater than a difference between a distance in the first direction between the common source line and the first dummy channel structure and a distance in the first direction between the common source line and the second dummy channel structure.

11. A three-dimensional semiconductor device comprising:
    a stacked structure disposed on a substrate and including a first pad region, a second pad region spaced apart from the first pad region in a first direction, and a cell region interposed between the first pad region and the second pad region; and a first common source line crossing the first pad region, the cell region, and the second pad region,
wherein the first common source line in the first pad region and the second pad region is parallel to a vertical direction perpendicular to a main surface of the substrate, and the first common source line in the cell region is tilted with respect to the vertical direction.

12. The three-dimensional semiconductor device of claim 11, further comprising a second common source line crossing the first pad region,
wherein the second common source line is parallel to the vertical direction.

13. The three-dimensional semiconductor device of claim 11, further comprising a third common source line crossing the second pad region,
wherein the third common source line is parallel to the vertical direction.

14. The three-dimensional semiconductor device of claim 11, wherein the first common source line in the cell region is tilted toward a center plane with respect to the vertical direction, with the center plane extending in the first direction and being parallel to the vertical direction and bisecting the stacked structure.

15. The three-dimensional semiconductor device of claim 11, wherein a distance between a center plane and the first common source line varies depending on a position in the first direction, with the center plane extending in the first direction and being parallel to the vertical direction and bisecting the stacked structure.

16. The three-dimensional semiconductor device of claim 15, wherein the distance between the center plane and the first common source line in the first pad region and the second pad region increases as the position in the first direction gets farther away from the cell region.

17. The three-dimensional semiconductor device of claim 15, wherein the distance between the center plane and the first common source line in the first pad region and the second pad region increases and then decreases as the position in the first direction gets farther away from the cell region.

18. The three-dimensional semiconductor device of claim 15, wherein
the first common source line comprises a first portion crossing the cell region, a second portion crossing the first pad region, and a third portion crossing the second pad region,
each of the first portion, the second portion, and the third portion of the first common source line is parallel to the first direction, and
the first portion is closer to the center plane than the second portion and the third portion.

19. The three-dimensional semiconductor device of claim 15, wherein
the first common source line comprises a plurality of portions,
each of the plurality of portions is parallel to the first direction, and
distances from the center plane to the plurality of portions are different.

20. A three-dimensional semiconductor device comprising:
a substrate;
a stacked structure disposed on the substrate, the stacked structure including a first pad region, a second pad region spaced apart from the first pad region in a first direction, and a cell region interposed between the first pad region and the second pad region;
a first dummy channel structure and a second dummy channel structure, both being located at one side of a center plane and passing through the first pad region, the center plane being perpendicular to a main surface of the substrate, extending in the first direction and bisecting the stacked structure;
a third dummy channel structure and a fourth dummy channel structure, both being located at the other side of the center plane and passing through the first pad region;
a first common source line passing between the first dummy channel structure and the second dummy channel structure; and
a second common source line passing between the third dummy channel structure and the fourth dummy channel structure,
wherein the first common source line is closer to one of the first dummy channel structure and the second dummy channel structure, whichever is farther away from the center plane, and
the second common source line is closer to one of the third dummy channel structure and the fourth dummy channel structure, whichever is farther away from the center plane.

* * * * *